(12) United States Patent
Kao et al.

(10) Patent No.: US 12,495,568 B2
(45) Date of Patent: Dec. 9, 2025

(54) DUMMY FIN STRUCTURES AND METHODS OF FORMING SAME

(71) Applicant: Taiwan Semiconductor Manufacturing Co., Ltd., Hsinchu (TW)

(72) Inventors: Wan-Yi Kao, Baoshan Township (TW); Hung Cheng Lin, Hsinchu (TW); Che-Hao Chang, Hsinchu (TW); Yung-Cheng Lu, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 732 days.

(21) Appl. No.: 17/676,470

(22) Filed: Feb. 21, 2022

(65) Prior Publication Data
US 2023/0268426 A1 Aug. 24, 2023

(51) Int. Cl.
*H10D 30/01* (2025.01)
*H01L 21/02* (2006.01)
*H10D 30/62* (2025.01)

(52) U.S. Cl.
CPC ... *H10D 30/0243* (2025.01); *H01L 21/02164* (2013.01); *H01L 21/02167* (2013.01); *H10D 30/6211* (2025.01)

(58) Field of Classification Search
CPC ............ H01L 29/6681; H01L 29/7851; H01L 21/02164; H01L 21/02167; H10D 30/0243; H10D 30/6211
See application file for complete search history.

(56) References Cited

U.S. PATENT DOCUMENTS

| | | | |
|---|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |

(Continued)

FOREIGN PATENT DOCUMENTS

| TW | 202205382 A | 2/2022 |
|---|---|---|
| TW | 202205435 A | 2/2022 |

(Continued)

*Primary Examiner* — Christine A Enad
(74) *Attorney, Agent, or Firm* — Slater Matsil, LLP

(57) ABSTRACT

A method includes depositing a first dielectric layer over and along sidewalls of a first semiconductor fin and a second semiconductor fin, where the first semiconductor fin and the second semiconductor fin extend upwards from a semiconductor substrate, depositing a second dielectric layer over the first dielectric layer, depositing a third dielectric layer over the second dielectric layer, where materials of the second dielectric layer and the third dielectric layer are different, and a material of the first dielectric layer is different from the material of the second dielectric layer and recessing the first dielectric layer and the second dielectric layer to expose sidewalls of the first semiconductor fin and the second semiconductor fin and to form a dummy fin between the first semiconductor fin and the second semiconductor fin.

20 Claims, 24 Drawing Sheets

(56) References Cited

U.S. PATENT DOCUMENTS

| | | |
|---|---|---|
| 9,576,814 B2 | 2/2017 | Wu et al. |
| 9,831,183 B2 | 11/2017 | Lin et al. |
| 9,859,386 B2 | 1/2018 | Ho et al. |
| 2020/0118867 A1* | 4/2020 | Lin ................. H01L 21/823431 |
| 2021/0098309 A1* | 4/2021 | Min ................. H01L 21/823481 |
| 2021/0376113 A1* | 12/2021 | Kao ................... H01L 29/0847 |
| 2022/0028752 A1 | 1/2022 | Huang et al. |
| 2022/0029011 A1 | 1/2022 | Kao et al. |
| 2022/0037321 A1 | 2/2022 | Kao et al. |
| 2022/0262955 A1 | 8/2022 | More et al. |

FOREIGN PATENT DOCUMENTS

| | | |
|---|---|---|
| TW | 202205445 A | 2/2022 |
| TW | 202205679 A | 2/2022 |

\* cited by examiner

DUMMY FIN STRUCTURES AND METHODS OF FORMING SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
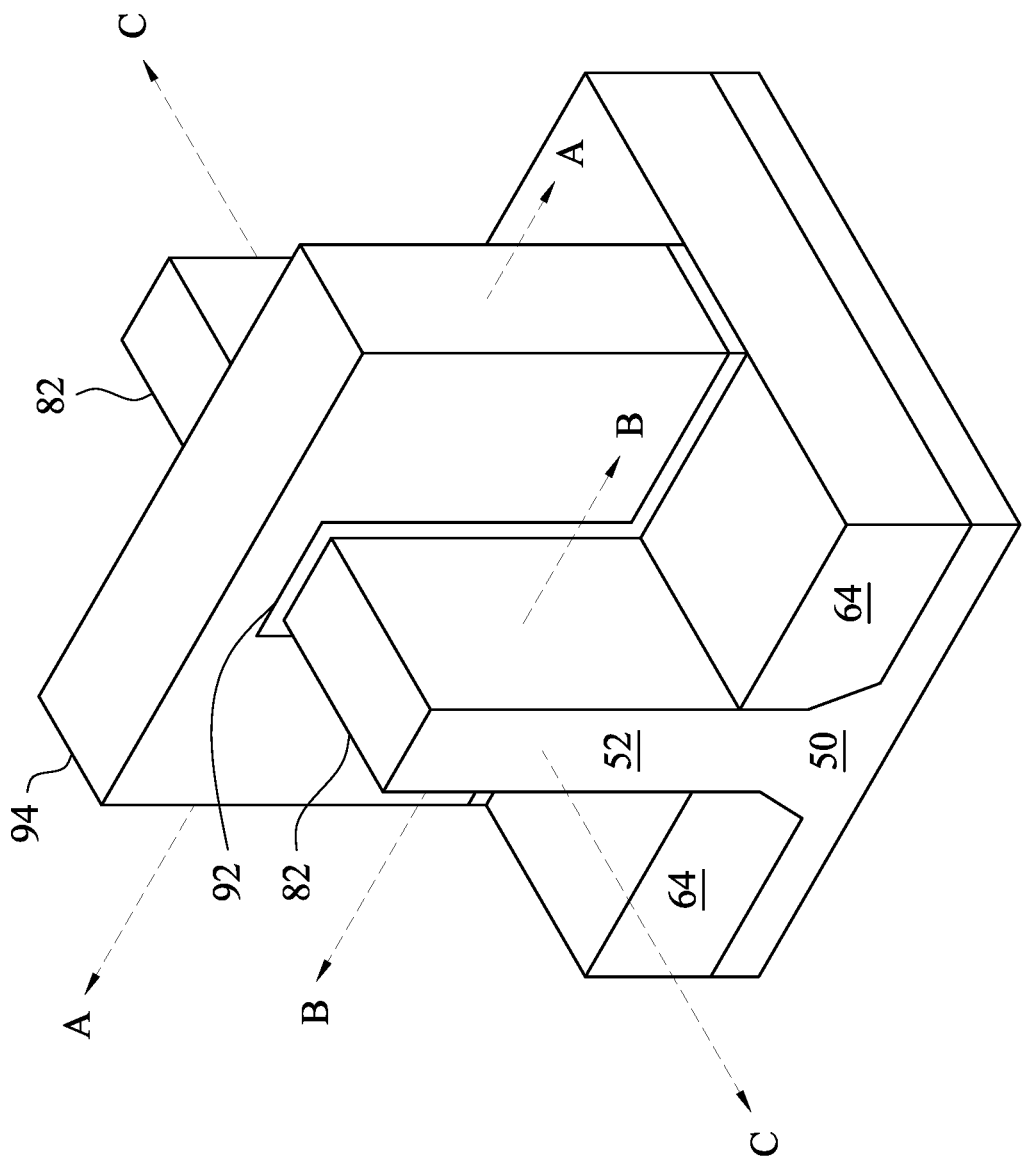
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include methods applied to, but not limited to the formation of a dummy fin (e.g., comprising one or more insulating layers) that may be used for different purposes. For example, the dummy fin (which may also be referred to subsequently as a dielectric fin) may be used to separate source/drain regions of adjacent semiconductor fins. The dummy fin may also be used in order to anchor dummy gate stacks that may be disposed directly on isolation regions disposed around semiconductor fins in areas with uneven fin spacing and/or between boundaries of different finFET regions. Embodiments disclosed herein include forming the dummy fin with at least one dielectric film that is carbon doped and/or comprises a high silicon percentage by weight of the dielectric film. As a result, the dummy fin has better etch resistance to an etch back process used to form shallow trench isolation (STI) regions surrounding the semiconductor fins. This results in lower dummy fin damage during the etch back process, and less dielectric film loss. This reduces the risk of shorting the source/drain regions of adjacent semiconductor fins, and lowers the risk of performance degradation.

FIG. 1 illustrates an example of a FinFET in a three-dimensional view, in accordance with some embodiments. The FinFET comprises a fin 52 on a substrate 50 (e.g., a semiconductor substrate). Isolation regions 64 are disposed in the substrate 50, and the fin 52 protrudes above and from between neighboring isolation regions 64. Although the isolation regions 64 are described/illustrated as being separate from the substrate 50, as used herein the term "substrate" may be used to refer to just the semiconductor substrate or a semiconductor substrate inclusive of isolation regions. A gate dielectric layer 92 is along sidewalls and over a top surface of the fin 52, and a gate electrode 94 is over the gate dielectric layer 92. Epitaxial source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example perpendicular to the direction of current flow between the epitaxial source/drain regions 82 of the FinFET. Cross-section B-B is parallel to cross-section A-A and extends through a source/drain region of the FinFET. Cross-section C-C is perpendicular to cross-section A-A and is along a longitudinal axis of the fin 52 and in a direction of, for example, a current flow between the epitaxial source/drain regions 82 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2, 3, 4, 5, 6, 7A, 7B, 8A, 8D, 9, 10A, 10B, 11A, 11B, 12, 13, 14, 15A, 15B, 16A, 16B, 17A, 17B, 18A, 18B, 18C, 18D, 19A, 19B, 19C, 20A, 20B, 21A, 21B, 21C, 21E, 22A and 22B are cross-sectional views of intermediate stages in the manufacturing of FinFETs, in accordance with some embodiments. FIGS. 19D, 21D and 21F are top-down views of the intermediate stages in the manufacturing of FinFETs, in accordance with some embodiments. FIGS. 2 3, 4, 5, 6, 7A, 7B, 8A, 8D, 9, 10A, 10B, 11A, 11B, 12, 13, 14, 15A, 16A, 17A, 18A, 19A, 19C, 20A, 21A, 21C, 21E and 22A illustrate reference cross-section A-A illustrated in FIG. 1, except for multiple fins/FinFETs. FIGS. 15B, 16B, 17B, 18B, 19B, 20B, 21B and 22B are illustrated along reference cross-section C-C illustrated in FIG. 1, except for multiple fins/FinFETs. FIGS. 18C and 18D are illustrated along reference cross-section B-B illustrated in FIG. 1, except for multiple fins/FinFETs.

Figure 2:
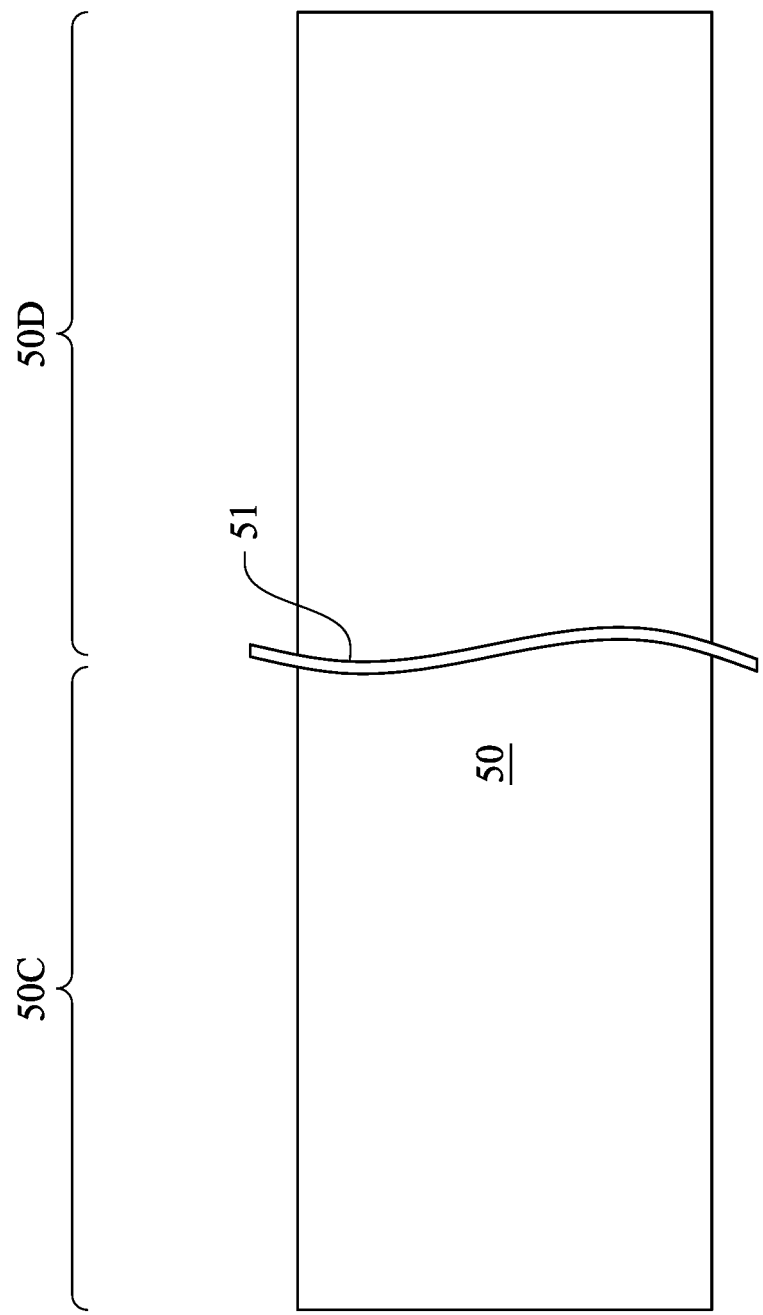
FIGS. 2, 3, 4, 5, 6, 7A, and 7B are cross-sectional views of intermediate stages in the manufacturing of FinFETs, in accordance with some embodiments.

FIG. 2 illustrates a substrate 50. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50C and a region 50D. The region 50C can be for forming n-type devices, such as NMOS transistors, e.g., n-type FinFETs. The region 50D can be for forming p-type devices, such as PMOS transistors, e.g., p-type FinFETs. In other embodiments, the region 50C can be for forming p-type devices, such as PMOS transistors, e.g., p-type FinFETs. The region 50D can be for forming n-type devices, such as NMOS transistors, e.g., n-type FinFETs. The region 50C may be physically separated from the region 50D (as illustrated by divider 51), and any number of device features (e.g., other active devices, doped regions, isolation structures, etc.) may be disposed between the region 50C and the region 50D. In some embodiments, both the region 50C and the region 50D are used to form the same type of devices, such as both regions being for n-type devices or p-type devices. In subsequent descriptions, only one region (e.g., either region 50C or 50D) is illustrated and any differences in forming different features in the other regions are described.

Figure 3:
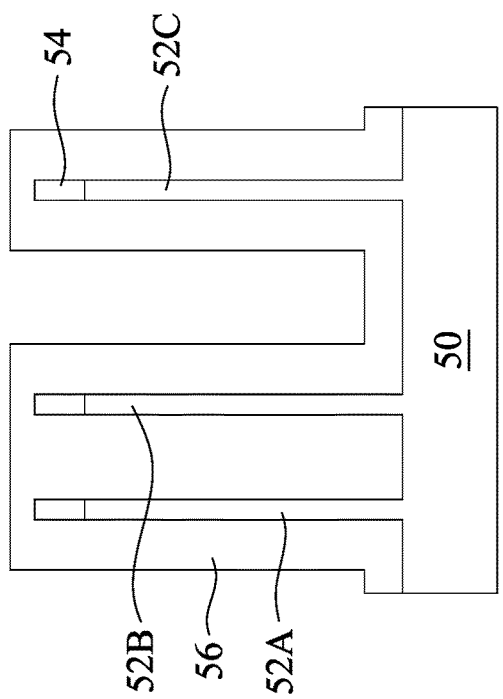

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. In such embodiment, a mask layer 54 may be used to define a pattern of the fins 52. In some embodiments, the mask layer 54 may comprise silicon oxide, silicon nitride, silicon oxynitride, or the like. In some embodiments, the mask layer 54 comprises multiple sub-layers, such as a sub-layer of silicon nitride over a sub-layer of silicon oxide. The fins include fins 52A, 52B, and 52C. The fins 52B and 52C may be spaced apart from each other such that a first fin pitch P1 (also referred to as a distance between centerlines) of the fins 52B and 52C is in a range from 20 nm to 200 nm. The fins 52A and 52B may be spaced apart from each other such that a second fin pitch P2 of the fins 52A and 52B is smaller than the first fin pitch P1, such as by being in a range from 10 nm to 30 nm.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, it may be advantageous to epitaxially grow a material in an NMOS region different from the material in a PMOS region. In various embodiments, the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. In some embodiments, the fins 52 in a PMOS region may be formed from silicon germanium, and the fins 52 in an NMOS region may be formed from silicon.

Figure 4:
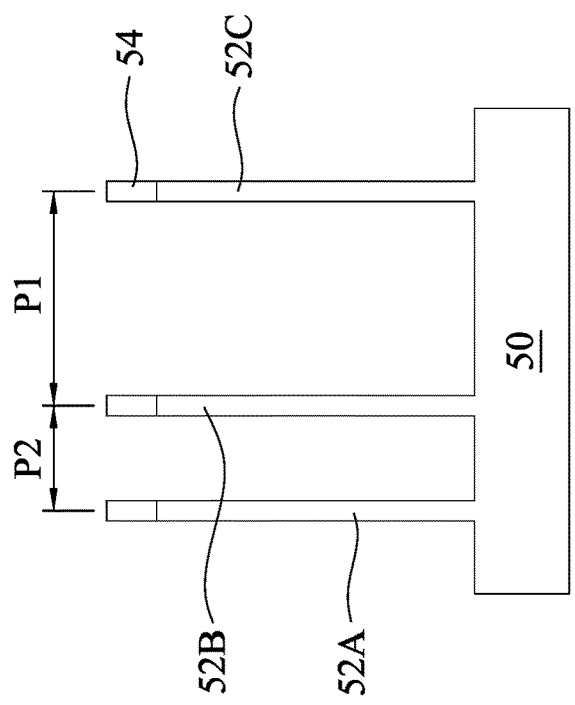

In FIG. 4, a dielectric layer 56 is deposited over and along sidewalls of the fins 52. The dielectric layer 56 may further extend along top surfaces of the fins 52 and top surfaces of the substrate 50 between the fins 52. The dielectric layer 56 may fill or overfill areas between some of the fins 52 (e.g., between the fins 52A and 52B) while other areas between the fins 52 may only be partially filled (e.g., between fins 52B and 52C). The deposition of the dielectric layer 56 may be performed using a conformal deposition process, such as, chemical vapor deposition (CVD), atomic layer deposition (ALD), or the like. In other embodiments, the deposition of the dielectric layer 56 may be performed using flowable-chemical vapor deposition (FCVD), or the like. The dielectric layer 56 may comprise any suitable insulating material, such as, silicon oxide, or the like.

Figure 5:
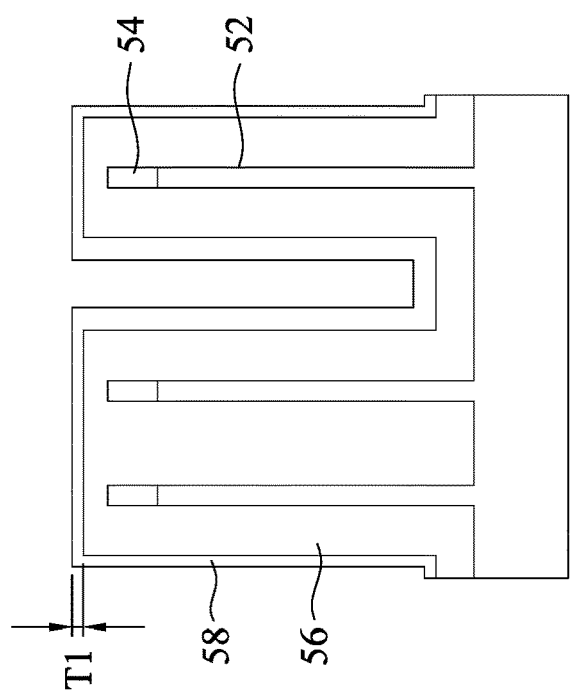

In FIG. 5, a dielectric layer 58 (which may also be referred to subsequently as a dielectric liner) is deposited over the dielectric layer 56 such that the dielectric layer 58 is disposed along sidewalls and top surfaces of the dielectric layer 56. The deposition of the dielectric layer 58 may be performed using a conformal deposition process, such as, CVD, ALD, or the like. The dielectric layer 58 may comprise silicon oxide, SiON, SiOCN, combinations thereof, or the like. In an embodiment, the dielectric layer 58 may have a first thickness T1 that is in a range from 1 nm to 5 nm.

Figure 6:
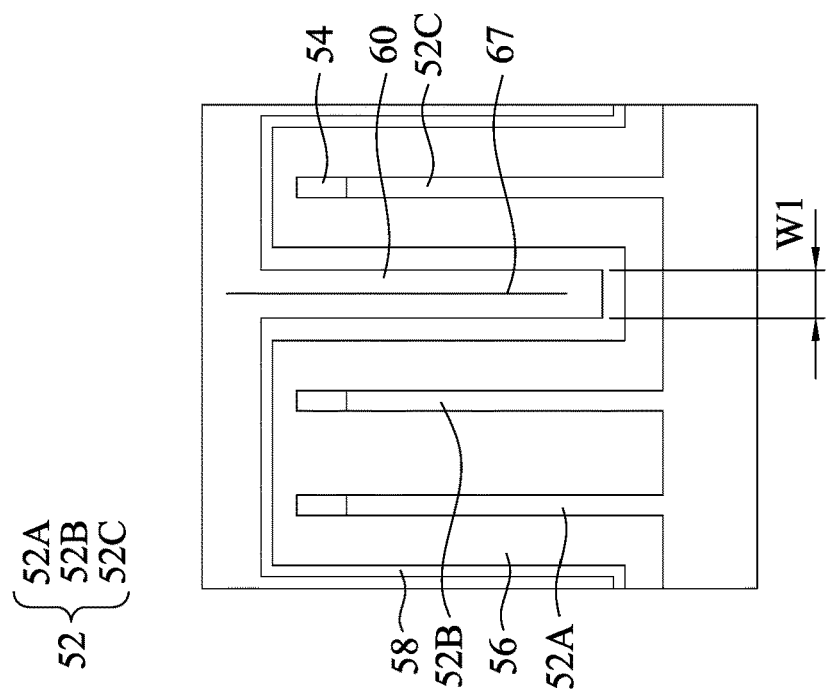

In FIG. 6, a dielectric layer 60 is deposited over the dielectric layer 56 and the dielectric layer 58. The dielectric layer 60 may be deposited between some of the fins 52 to fill or overfill areas between the fins 52 (e.g., between the fins 52B and 52C). The deposition of the dielectric layer 60 may be performed using a conformal deposition process, such as, CVD, ALD, or the like. The dielectric layer 60 between some of the fins 52 (e.g., the fins 52B and 52C) may be deposited until it merges together (e.g., physically contacts each other), thereby filling a remaining space between adjacent fins 52 and forming a seam 67. In an embodiment, the dielectric layer 60 is carbon-doped such that the dielectric layer 60 comprises a carbon-containing dielectric film (e.g., a carbon-containing nitride, such as, SiCN or a carbon-containing oxide, such as, SiOC or SiCO), or the like. In other embodiments, the dielectric layer may comprise SiN, or the like.

In an embodiment, the dielectric layer 60 comprises SiCN and has a carbon concentration that is in a range from 15 percent to 25 percent by weight of carbon. The carbon concentration influences the hardness of the dielectric layer 60, and a greater carbon concentration can increase the hardness of the dielectric layer 60 and result in the dielectric layer 60 being more resistant to subsequent etch process (e.g., an etch back process shown in FIG. 8A). The dielectric layer 60 comprising SiCN and having a carbon concentration that is smaller than 15 percent or larger than 25 percent results in a lower resistance of the dielectric layer 60 to subsequent etch process (e.g., an etch back process shown in FIG. 8A).

In an embodiment, the dielectric layer 60 has a silicon concentration that is in a range from 45 percent to 50 percent by weight of silicon. The silicon concentration may influence the stress properties of the dielectric layer 60. For example, a greater silicon concentration may result in the dielectric layer 60 having more tensile stress, allowing it to be used in the formation of dummy fin 32 (shown subsequently in FIG. 8A) that can better anchor subsequently formed dummy gates 72 (shown in FIGS. 16A and 16B). The dielectric layer 60 comprising a silicon concentration that is smaller than 45 percent results in a lower resistance of the dielectric layer 60 to subsequent etch process (e.g., an etch back process shown in FIG. 8A). The dielectric layer 60 comprising a silicon concentration that is greater than 50 percent results in increased surface roughness of the dielectric layer 60.

In an embodiment, the dielectric layer 60 is deposited in order to fill and or overfill the region between the fin 52B and fin 52C. As such, a first width W1 of a portion of the dielectric layer 60 between adjacent fins 52 (e.g., the fins 52B and 52C) is in a range from 5 nm to 50 nm. However, any suitable dimensions may be utilized.

Figure 7B:
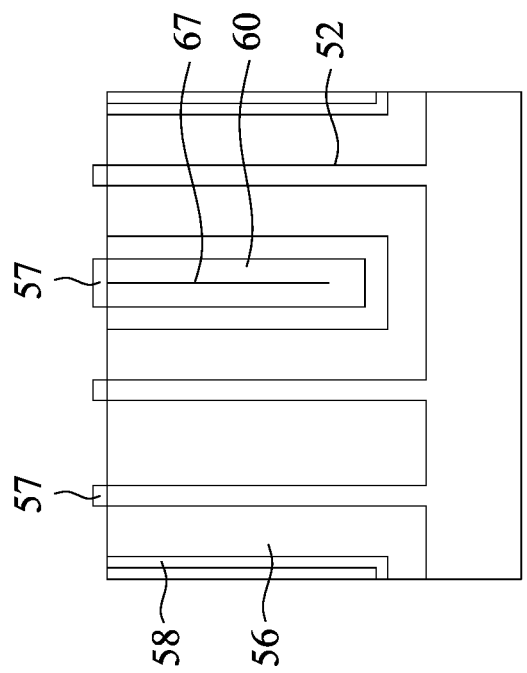
Figure 7A:
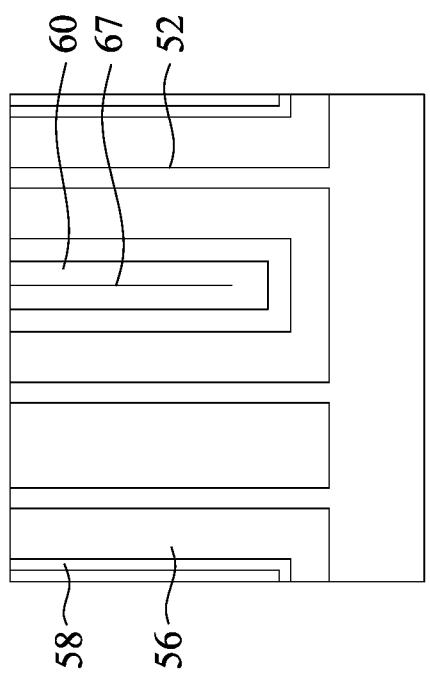

In FIG. 7A, a planarization (e.g., a chemical mechanical polish (CMP)) and/or etch back process (e.g., a dry etching process) is used to expose upper surfaces of the fins 52. In particular, upper portions of the dielectric layer 60, the dielectric layer 58, the dielectric layer 56, and the mask layer 54 are removed so that the fins 52 are exposed. In some embodiments, exposing the fins 52 results in upper surfaces of the dielectric layer 60, the dielectric layer 58, the dielectric layer 56, and the fins 52 being substantially coplanar. In other embodiments, exposing the fins 52 results in upper surfaces of the dielectric layer 60, the dielectric layer 58, the dielectric layer 56, and the fins 52 being non-coplanar.

FIG. 7B illustrates an alternative embodiment. Unless specified otherwise, like reference numerals in this embodiment (and subsequently discussed embodiments) represent like components in the embodiment shown in FIGS. 1 through 7A formed by like processes. Accordingly, the process steps and applicable materials may not be repeated herein. The initial steps of this embodiment are essentially the same as shown in FIGS. 1 through 7A. In FIG. 7B, an optional dielectric layer 57 is selectively deposited over the fins 52 and the dielectric layer 60 using a deposition process such as CVD, ALD, or the like. In an embodiment, the dielectric layer 57 may comprise SiN, SiCN, or the like. Precursors that may be used for the deposition of the dielectric layer 57 include $SiH_2Cl_2$, silane, a combination thereof, or the like. The dielectric layer 57 is selectively deposited on materials of the fins 52 and the dielectric layer 60, but is not deposited on any material that comprises an oxide (e.g., when the dielectric layer 60 comprises SiCN, and the dielectric layer 56 and the dielectric layer 58 comprise silicon oxide).

Figure 8A:
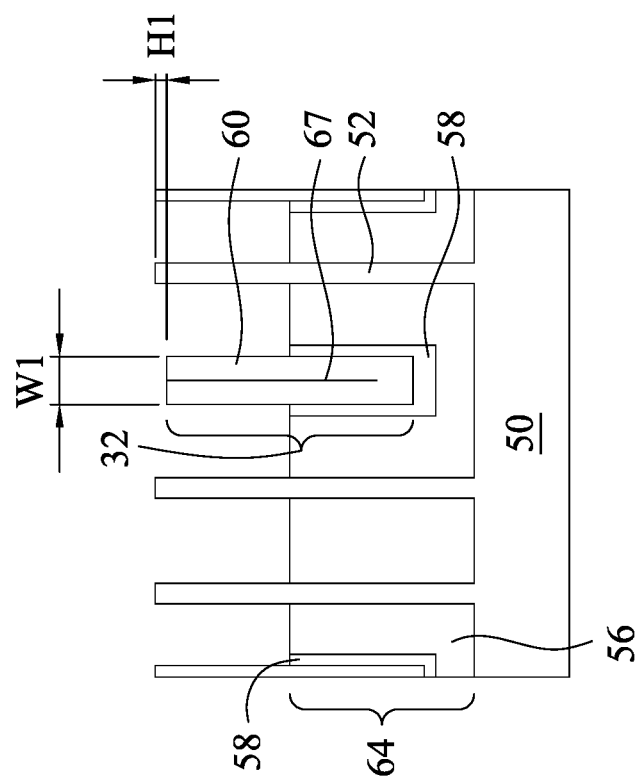
FIG. 8A is a cross-sectional view of an intermediate stage in the manufacturing of FinFETs, in accordance with some embodiments.

In FIG. 8A, an additional etch back process is then performed on the dielectric layer 56 and the dielectric layer 58 of FIG. 7A. The dielectric layer 56 and the dielectric layer 58 are recessed such that portions of fins 52 and dummy fins 32 protrude above top surfaces of the dielectric layer 56 and the dielectric layer 58. The etch back process used to pattern the dielectric layer 56 and the dielectric layer 58 may use a selective etching process, which selectively etches the dielectric layer 56 and the dielectric layer 58 at a faster rate than the dielectric layer 60 and the fins 52. For example, the etching process may be a dry etch that comprises CFx, CxFy, or the like as etchants. The etching process may be performed at a temperature of about 30° C. to about 120° C. Such selective etching may be enabled, for example, by the inclusion of carbon in the dielectric layer 60.

In some embodiments, after recessing, top surfaces of the fins 52 may be higher than top surfaces of the dummy fins 32 by a height H1. This is due to a small amount of film loss of the dummy fins 32 during the etch back process. The height H1 may be in a range from 5 nm to 20 nm. Each dummy fin 32 is made of the dielectric layer 60, and may comprise a first portion which extends above a top surface of the dielectric layer 56 and the dielectric layer 58, and a second portion below the top surface of the dielectric layer 56. Thus, the dummy fins 32 may have a different material composition than fins 52, and the dummy fins 32 may be insulating fins. The dielectric layer 56, the dielectric layer 58, and the second portions of the dummy fins 32 (which may also be referred to collectively as isolation region 64) provide electrical isolation between adjacent fins 52 and may further provide shallow trench isolation (STI) regions between the fins 52 such that a separate STI region need not be formed. Each of the dummy fins 32 may have the first width W1, or may be slightly smaller than the first width W1 because of the additional etch back process.

Figure 8C:
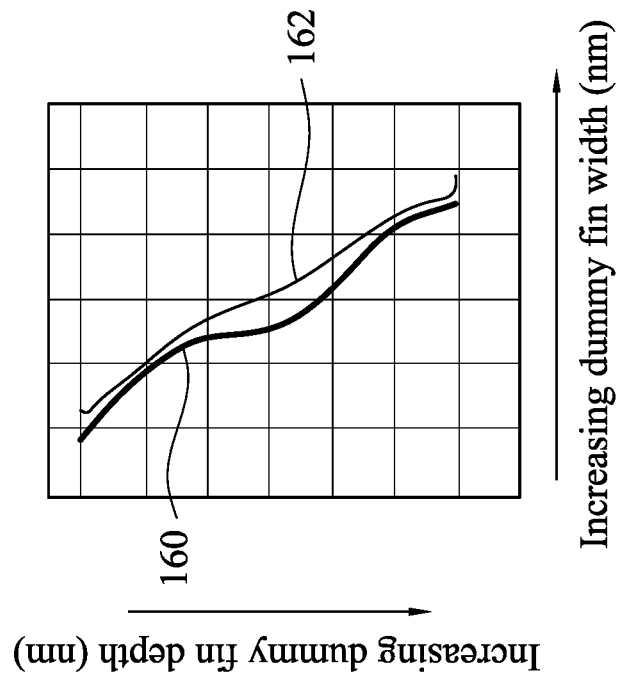
FIG. 8C shows traces of dummy fin depth versus dummy fin width for dummy fins having different carbon concentrations.
Figure 8B:
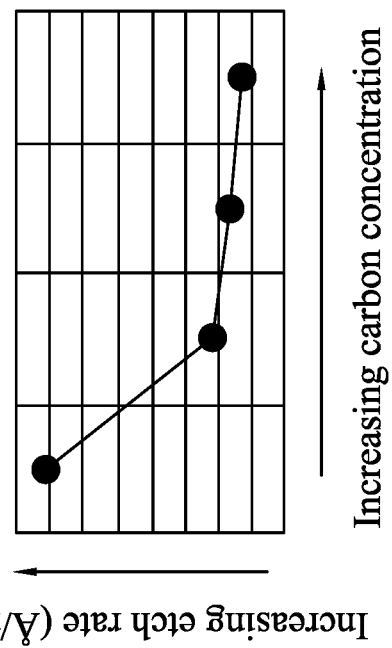
FIG. 8B shows an etch rate versus carbon concentration trace for dummy fins during the manufacturing of the FinFET referenced in FIG. 8A.

FIG. 8B shows an etch rate versus carbon concentration trace for the dummy fin 32 during the etch back process. FIG. 8B shows that increasing the carbon concentration of the dielectric layer 60 of the dummy fin 32 results in decreasing etch rates of the dielectric layer 60 during the etch back process.

FIG. 8C shows traces of dummy fin depth versus dummy fin width for the dummy fins 32 after the etch back process is performed to form the dummy fins 32. A trace 160 corresponds to a dummy fin 32 comprising the dielectric layer 60 having a first carbon concentration that is below a range from 15 percent to 25 percent by weight of carbon. A trace 162 corresponds to a dummy fin 32 comprising the dielectric layer 60 having a second carbon concentration that is within a range from 15 percent to 25 percent by weight of carbon. FIG. 8C shows that the dummy fin 32 corresponding to the trace 162 has a larger dummy fin width than the dummy fin 32 corresponding to the trace 160 when the dummy fin widths of each are measured at the same depth. This is a result of reduced etch rates and reduced dielectric film loss of the dummy fin 32 that corresponds to the trace 162.

Advantages can be achieved as a result of the formation of the dummy fins 32 comprising the dielectric layer 60, and where the dielectric layer 60 includes SiCN having a carbon concentration that is in a range from 15 percent to 25 percent by weight of carbon. These include the dummy fins 32 having a better etch resistance to the etch back process. This results in lower dummy fin 32 damage during the etch back process, and less dielectric film loss. This reduces the risk of shorting subsequently formed epitaxial source/drain regions 82 (e.g., shown subsequently in FIGS. 18C and 18D) of adjacent fins 52, and lowers the risk of performance degradation. In addition, the etch resistance and dielectric film loss reduction is especially significant for dummy fins 32 having a first width W1 that is less than 11 nm.

Other advantages can be achieved a result of the formation of the dummy fins 32 comprising the dielectric layer 60, and where the dielectric layer 60 comprises a silicon concentration that is in a range from 45 percent to 50 percent by weight of silicon. These include the dummy fins 32 being having a tensile stress and therefore being able to better anchor subsequently formed dummy gates 72 (shown subsequently in FIGS. 16A and 16B).

Still referring to FIG. 8A, appropriate wells (not shown) may be formed in the fins the fins 52 and/or the substrate 50. In some embodiments, a P well may be formed in the region 50C (not separately illustrated in FIG. 8A), and an N well may be formed in the region 50D (also not separately illustrated in FIG. 8A). In some embodiments, an N well may be formed in the region 50C, and a P well may be formed in the region 50D. In some embodiments, a P well or an N well are formed in both the region 50C and the region 50D.

In the embodiments with different well types, the different implant steps for the region 50C and the region 50D (see FIG. 2) may be achieved using a photoresist or other masks (not shown). For example, a photoresist may be formed over the fins 52 and the dummy fins 32 in the region 50C. The photoresist is patterned to expose the region 50D of the substrate 50, such as a PMOS region. The photoresist can be formed by using a spin-on technique and can be patterned using acceptable photolithography techniques. Once the photoresist is patterned, an n-type impurity implant is performed in the region 50D, and the photoresist may act as a mask to substantially prevent n-type impurities from being implanted into the region 50C, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50D, a photoresist is formed over the fins 52 and the dummy fins 32 in the region 50D. The photoresist is patterned to expose the region 50C of the substrate 50, such as the NMOS region. The photoresist can be formed by using a spin-on technique and can be patterned using acceptable photolithography techniques. Once the photoresist is patterned, a p-type impurity implant may be performed in the region 50C, and the photoresist may act as a mask to substantially prevent p-type impurities from being implanted into the region 50D, such as the PMOS region. The p-type impurities may be boron, BF$_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50C and the region 50D, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 8D:
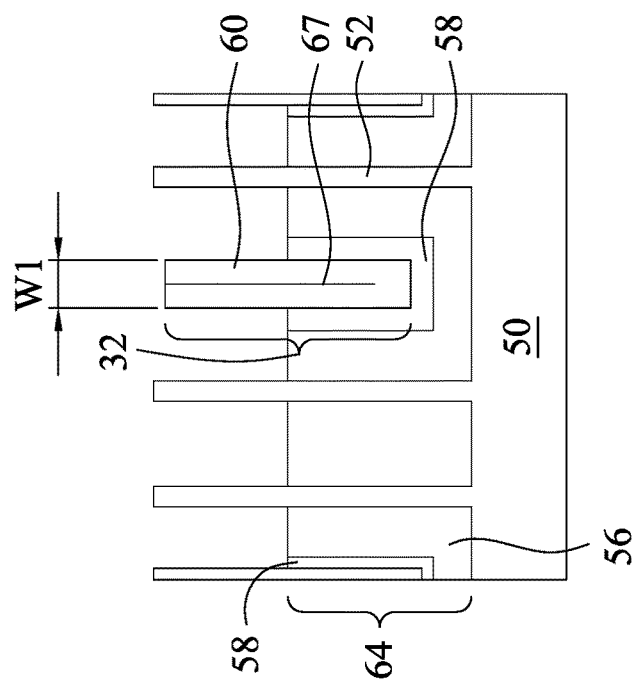

In FIG. 8D, the etch back process described in FIG. 8A is performed on the dielectric layer 56 and the dielectric layer 58 of the alternative embodiment shown in FIG. 7B. The dielectric layer 56 and the dielectric layer 58 are recessed such that portions of the fins 52 and the dummy fins 32 protrude above top surfaces of the dielectric layer 56 and the dielectric layer 58. In some embodiments, after recessing, top surfaces of the fins 52 may be coplanar with top surfaces of the dummy fins 32. This is due to the dielectric layer 57 on the dummy fins 32, which acts as a sacrificial layer during the etch back process and provides further protection to prevent film loss in the dummy fins 32. In an embodiment in which the dielectric layer 57 is not removed by the etch back process, the dielectric layer 57 may be removed by any other suitable process. Each of the dummy fins 32 is made of the dielectric layer 60, and may comprise a first portion which extends above a top surface of the dielectric layer 56 and the dielectric layer 58, and a second portion below the top surface of the dielectric layer 56. Thus, the dummy fins 32 may have a different material composition than fins 52, and the dummy fins 32 may be insulating fins. The dielectric layer 56, the dielectric layer 58, and the second portions of the dummy fins 32 (which may also be referred to collectively as isolation region 64) provide electrical isolation between adjacent fins 52 and may further provide shallow trench isolation (STI) regions between the fins 52 such that a separate STI region need not be formed. Each of the dummy fins 32 may have the first width W1. After the etch back process is performed, appropriate wells (not shown) may be formed in the fins 52 and/or the substrate 50 in a manner similar to that as described previously in FIG. 8A.

Figure 9:
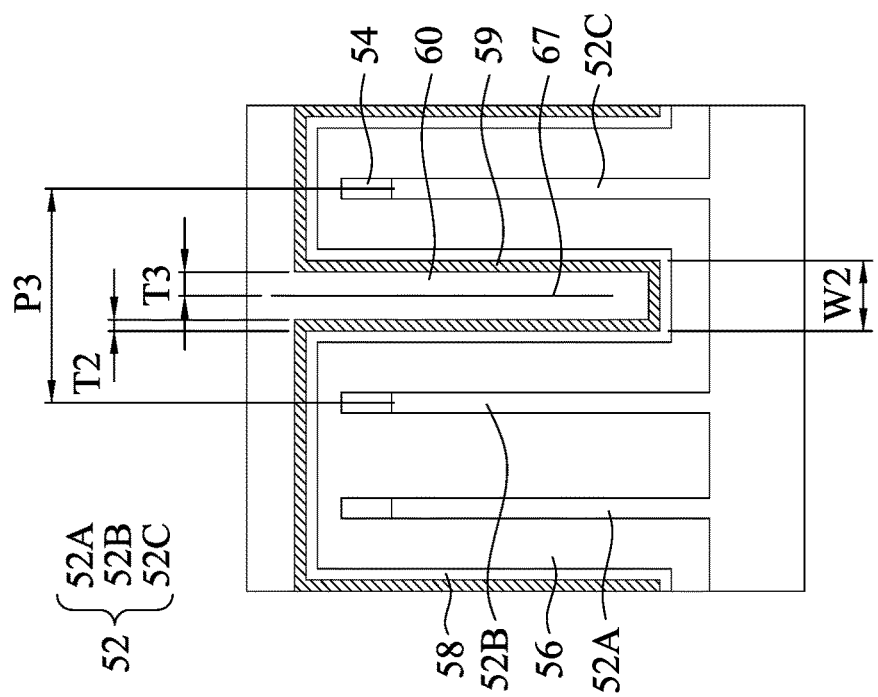
FIGS. 8D, 9, 10A, 10B, 11A, 11B, 12, 13, 14, 15A, 15B, 16A, 16B, 17A, 17B, 18A, 18B, 18C, 18D, 19A, 19B and 19C are cross-sectional views of intermediate stages in the manufacturing of FinFETs, in accordance with some embodiments.

FIGS. 9 through 10A and FIG. 11 illustrate an alternative embodiment in which dummy fins 34 are formed that comprise a dielectric layer 59 and the dielectric layer 60 (described previously in FIG. 6). The dummy fins 34 are formed when fins 52B and 52C are spaced apart from each other such that they have a third fin pitch P3. Unless specified otherwise, like reference numerals in this embodiment (and subsequently discussed embodiments) represent like components in the embodiment shown in FIGS. 1 through 8D formed by like processes. Accordingly, the process steps and applicable materials may not be repeated herein. FIG. 9 shows that fins 52B and 52C may be spaced apart from each other such that the third fin pitch P3 of the fins 52B and 52C is larger than the first fin pitch P1. The third fin pitch P3 may be in a range from 20 nm to 50 nm. The initial steps of this embodiment may be the same as shown in FIGS. 1 through 5. A dielectric layer 59 is deposited over the dielectric layer 58 such that the dielectric layer 59 is disposed along sidewalls and top surfaces of the dielectric layer 58. The deposition of the dielectric layer 59 may be performed using a conformal deposition process, such as, CVD, ALD, or the like. In an embodiment, the dielectric layer 59 is carbon-doped such that the dielectric layer 59 comprises a carbon-containing dielectric film (e.g., a carbon-containing nitride, such as, SiCN or a carbon-containing oxide, such as, SiOC or SiCO), or the like. In an embodiment, the dielectric layer 59 may comprise SiN, or the like. In an embodiment, the dielectric layer 59 may have a second thickness T2 that may be in a range from 1 nm to 5 nm.

In an embodiment, the dielectric layer 59 comprises SiCN and has a carbon concentration that is in a range from 15 percent to 25 percent by weight of carbon. The carbon concentration influences the hardness of the dielectric layer 59, and a greater carbon concentration can increase the hardness of the dielectric layer 59 and result in the dielectric layer 59 being more resistant to subsequent etch process (e.g., an etch back process shown in FIG. 11).

In an embodiment, the dielectric layer 59 has a silicon concentration that is in a range from 45 percent to 50 percent by weight of silicon. The silicon concentration may influence the stress properties of the dielectric layer 59. For example, a greater silicon concentration may result in the dielectric layer 59 having more tensile stress, allowing it to be used in the formation of dummy fin 34 (shown subsequently in FIG. 11) that can better anchor subsequently formed dummy gates 72 (shown in FIGS. 16A and 16B).

After the deposition of the dielectric layer 59, the dielectric layer 60 is deposited over the dielectric layer 56, the dielectric layer 58 and the dielectric layer 59. The dielectric layer 60 may be deposited between some of the fins 52 to fill or overfill areas between the fins 52 (e.g., between the fins 52B and 52C). The deposition of the dielectric layer 60 may be performed using a conformal deposition process, such as, CVD, ALD, or the like. The dielectric layer 60 between some of the fins 52 (e.g., the fins 52 and 52C) may be deposited until it merges together (e.g., physically contacts each other), thereby filling a remaining space between adjacent fins 52 and forming the seam 67. In an embodiment, each portion of the dielectric layer 60 on opposite sides of the seam 67 and in between adjacent fins 52 (e.g., the fins 52B and 52C) may have a third thickness T3. The third thickness T3 may be in a range from 5 nm to 15 nm. In an embodiment, the second thickness T2 and the third thickness T3 may be the same. In an embodiment, the second thickness T2 and the third thickness T3 may be different. In an embodiment, the third thickness T3 is larger than the second thickness T2. In an embodiment, the dielectric layer 60 is carbon-doped such that the dielectric layer 60 comprises a carbon-containing dielectric film (e.g., a carbon-containing nitride, such as, SiCN or a carbon-containing oxide, such as, SiOC or SiCO), or the like. In an embodiment, the dielectric layer 60 comprises SiN, or the like. In an embodiment, the dielectric layer 60 comprises SiCN and has a carbon concentration that is in a range from 15 percent to 25 percent by weight of carbon. In an embodiment, the dielectric layer 60 has a silicon concentration that is in a range from 45 percent to 50 percent by weight of silicon.

In an embodiment a second width W2 of portions of the dielectric layer 60 and the dielectric layer 59 between adjacent fins 52 (e.g., the fins 52B and 52C) is in a range from 8 nm to 18 nm. In an embodiment in which the third fin pitch P3 of the fins 52B and 52C is larger than the first fin pitch P1, the second width W2 is larger than the first width W1.

In an embodiment, the dielectric layer 59 and the dielectric layer 60 may comprise the same material and have the same material composition. In another embodiment, the dielectric layer 59 and the dielectric layer 60 may have different percentage carbon concentrations by weight and/or different percentage silicon concentrations by weight. In an embodiment, the dielectric layer 59 may have a greater percentage atomic carbon concentration than a percentage atomic carbon concentration of the dielectric layer 60.

Figure 10B:
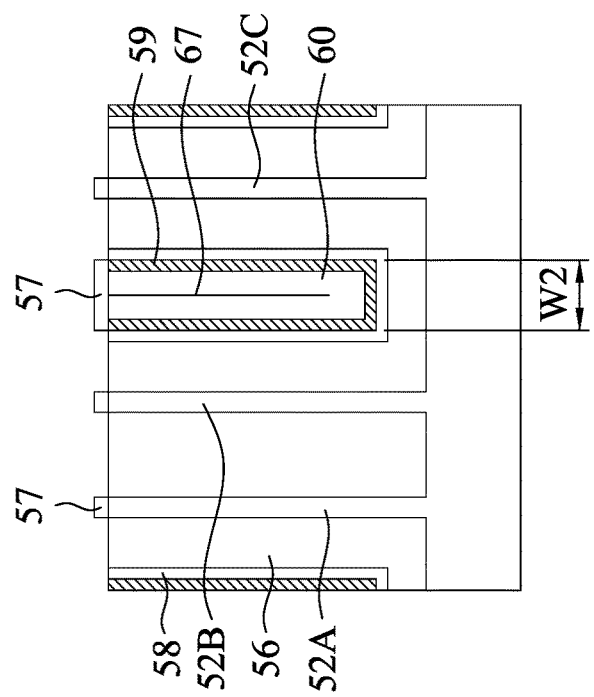
Figure 10A:
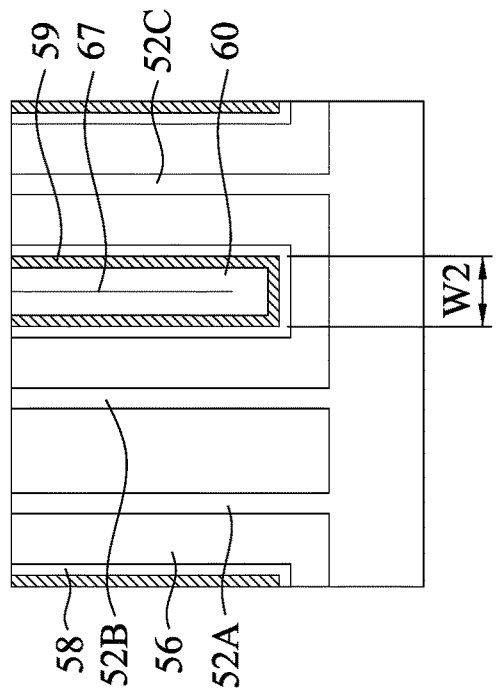

In FIG. 10A, a planarization (e.g., a chemical mechanical polish (CMP)) and/or etch back process (e.g., a dry etching process) is used to expose upper surfaces of the fins 52. In particular, upper portions of the dielectric layer 60, the dielectric layer 59, the dielectric layer 58, the dielectric layer 56, and the mask layer 54 are removed so that the fins 52 are exposed. In some embodiments, exposing the fins 52 results in upper surfaces of the dielectric layer 60, the dielectric layer 59, the dielectric layer 58, the dielectric layer 56, and the fins 52 being substantially coplanar. In other embodiments, exposing the fins 52 results in upper surfaces of the dielectric layer 60, the dielectric layer 59, the dielectric layer 58, the dielectric layer 56, and the fins 52 being non-coplanar.

FIG. 10B illustrates an alternative embodiment. Unless specified otherwise, like reference numerals in this embodiment (and subsequently discussed embodiments) represent like components in the embodiment shown in FIGS. 1 through 10A formed by like processes. Accordingly, the process steps and applicable materials may not be repeated herein. In FIG. 10B, the optional dielectric layer 57 (described earlier in FIG. 7B) is selectively deposited over the structure shown in FIG. 10A, such as the fins 52, the dielectric layer 59 and the dielectric layer 60. The dielectric layer 57 is selectively deposited on materials of the fins 52, the dielectric layer 59 and the dielectric layer 60, but is not deposited on any material that comprises an oxide (e.g., when the dielectric layer 59 and the dielectric layer 60 comprise SiCN, and the dielectric layer 56 and the dielectric layer 58 comprise silicon oxide).

Figure 11B:
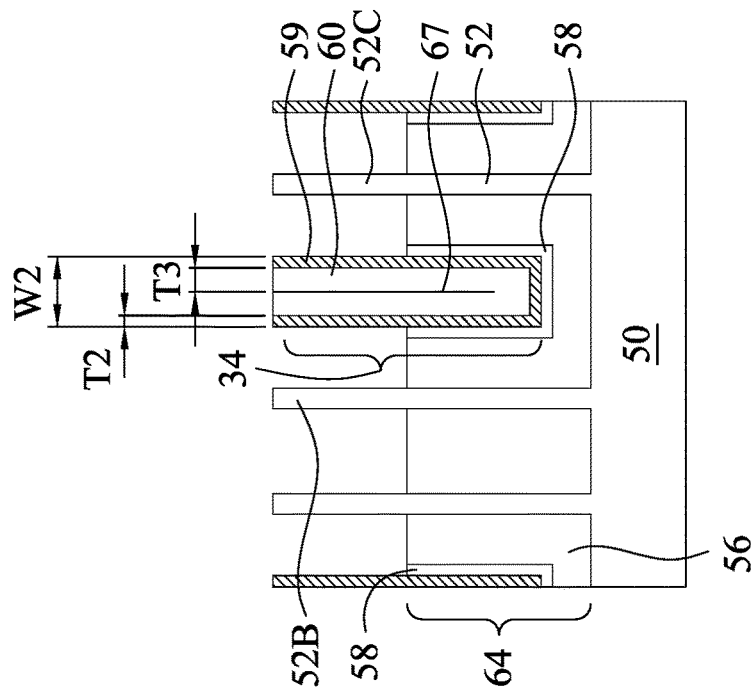
Figure 11A:
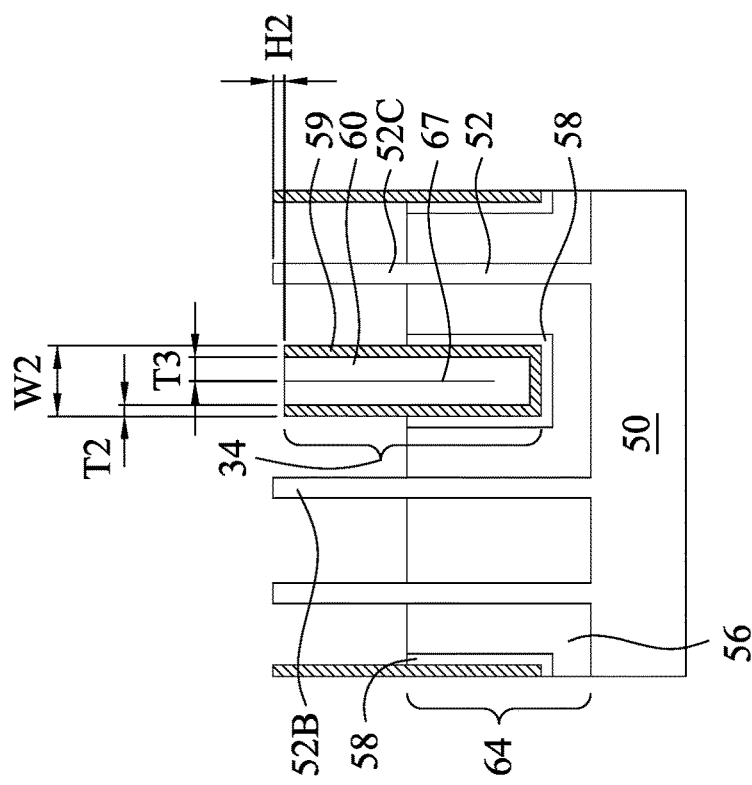

In FIG. 11A, an additional etch back process (e.g., similar to the additional etch back process described previously in FIG. 8A) is then performed on the dielectric layer 56 and the dielectric layer 58 of FIG. 10A. The dielectric layer 56 and the dielectric layer 58 are recessed such that portions of fins 52 and dummy fins 34 protrude above top surfaces of the dielectric layer 56 and the dielectric layer 58. In some embodiments, after recessing, top surfaces of the fins 52 may be higher than top surfaces of the dummy fins 34 by a height H2. This is due to a small amount of film loss of the dummy fins 34 during the etch back process. The height H2 may be in a range from 5 nm to 20 nm. Each dummy fin 34 is made of the dielectric layer 59 and the dielectric layer 60, and may comprise a first portion which extends above a top surface of the dielectric layer 56 and the dielectric layer 58, and a second portion below the top surface of the dielectric layer 56. Thus, the dummy fins 34 may have a different material composition than fins 52, and the dummy fins 34 may be insulating fins. The dielectric layer 56, the dielectric layer 58, and the second portions of the dummy fins 34 (which may be referred to collectively as isolation region 64) provide electrical isolation between adjacent fins 52 and may further provide shallow trench isolation (STI) regions between the fins 52 such that a separate STI region need not be formed. Each of the dummy fins 34 may have the second width W2.

After the etch back process is performed, appropriate wells (not shown) may be formed in the fins 52 and/or the substrate 50 in a manner similar to that as described previously in FIG. 8A.

Advantages can be achieved as a result of the formation of the dummy fins 34 comprising the dielectric layer 59 and the dielectric layer 60, which include SiCN having a carbon concentration that is in a range from 15 percent to 25 percent by weight of carbon. These include the dummy fins 34 having a better etch resistance to the etch back process. This results in reduced dummy fin 34 damage during the etch back process, and less dielectric film loss. This reduces the risk of shorting subsequently formed epitaxial source/drain regions 82 (e.g., shown subsequently in FIGS. 18C and 18D) of adjacent fins 52, and lowers the risk of performance degradation. In addition, the etch resistance and dielectric film loss reduction is especially significant for dummy fins 34 having a second width W2 that is less than 11 nm.

Other advantages can be achieved a result of the formation of the dummy fins 34 comprising the dielectric layer 59 and the dielectric layer 60, which include SiCN having a silicon concentration that is in a range from 45 percent to 50 percent by weight of silicon. These include the dummy fins 34 having a tensile stress and therefore being able to better anchor subsequently formed dummy gates 72 (shown subsequently in FIGS. 16A and 16B).

In FIG. 11B, the etch back process described in FIG. 11A is performed on the dielectric layer 56 and the dielectric layer 58 of the alternative embodiment shown in FIG. 10B. The dielectric layer 56 and the dielectric layer 58 are recessed such that portions of the fins 52 and the dummy fins 34 protrude above top surfaces of the dielectric layer 56 and the dielectric layer 58. In some embodiments, after recessing, top surfaces of the fins 52 may be coplanar with top surfaces of the dummy fins 34. This is due to the dielectric layer 57 on the dummy fins 34, which acts as a sacrificial layer during the etch back process and provides further protection to prevent film loss in the dummy fins 34. In an embodiment in which the dielectric layer 57 is not fully removed by the etch back process, the dielectric layer 57 may be removed by any other suitable process. Each of the dummy fins 34 is made of the dielectric layer 59 and the dielectric layer 60, and may comprise a first portion which extends above a top surface of the dielectric layer 56 and the dielectric layer 58, and a second portion below the top surface of the dielectric layer 56. Thus, the dummy fins 34 may have a different material composition than fins 52, and the dummy fins 34 may be insulating fins. The dielectric layer 56, the dielectric layer 58, and the second portions of the dummy fins 34 (which may also be referred to collectively as isolation region 64) provide electrical isolation between adjacent fins 52 and may further provide shallow trench isolation (STI) regions between the fins 52 such that a separate STI region need not be formed. Each of the dummy fins 34 may have the second width W2. After the etch back process is performed, appropriate wells (not shown) may be formed in the fins 52 and/or the substrate 50 in a manner similar to that as described previously in FIG. 8A.

Figure 13:
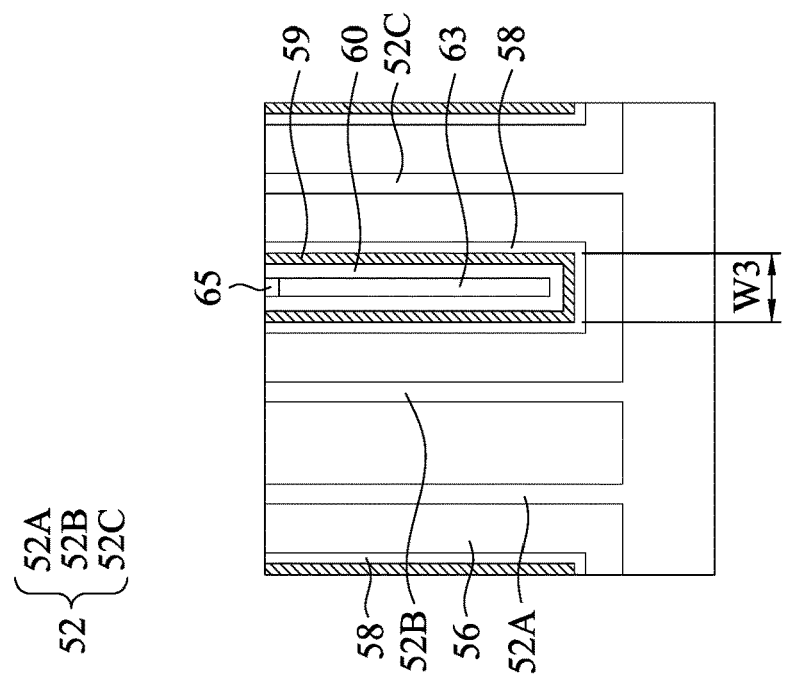
Figure 12:
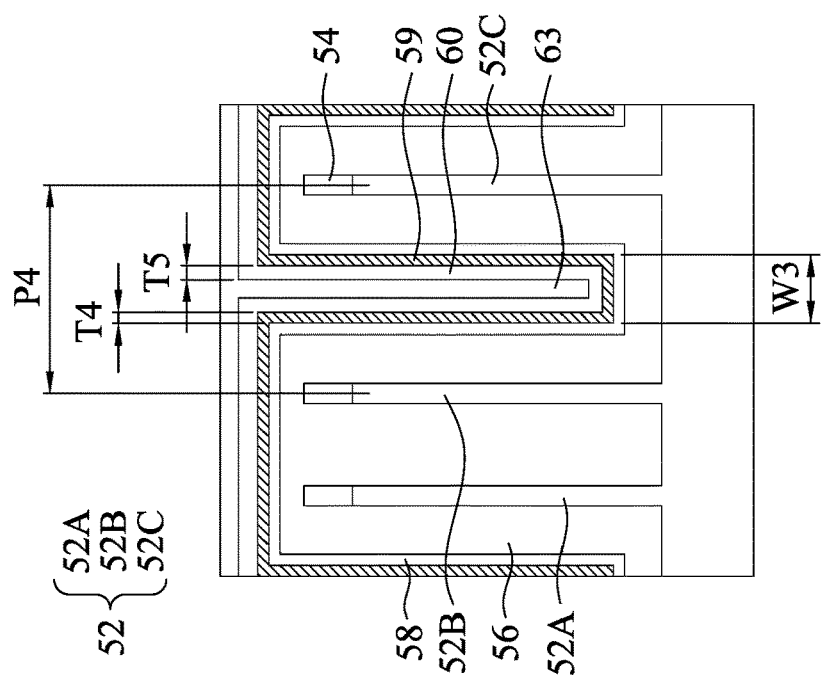
Figure 14:
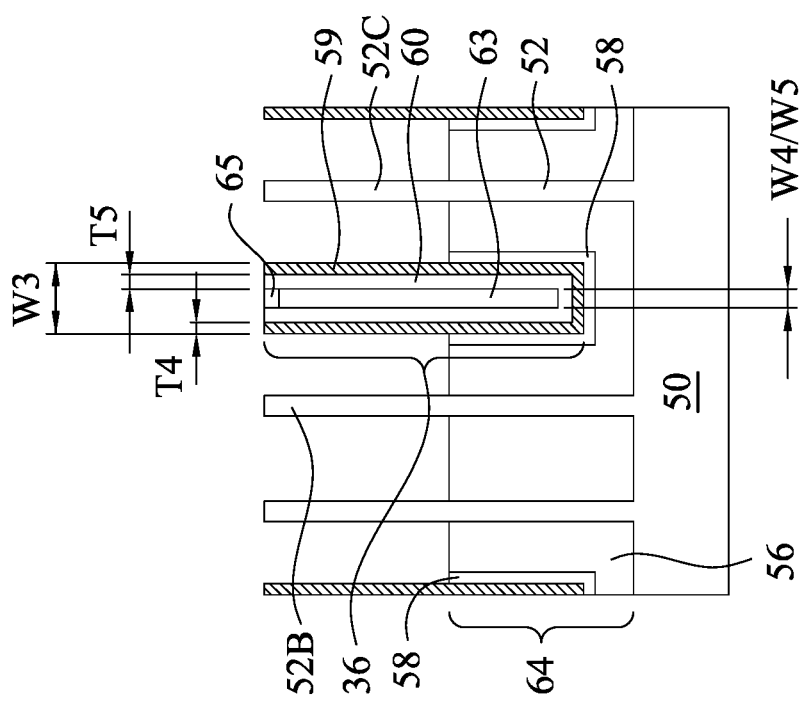

FIG. 12 through 14 illustrate another alternative embodiment in which dummy fins 36 are formed that comprise the dielectric layer 59 (described previously in FIG. 9), the dielectric layer 60 (described previously in FIG. 6), a dielectric layer 63, and a dielectric layer 65. The dummy fins 36 are formed when fins 52B and 52C are spaced apart from each other such that they have a fourth fin pitch P4. Unless specified otherwise, like reference numerals in this embodiment (and subsequently discussed embodiments) represent like components in the embodiment shown in FIGS. 1 through 11B formed by like processes. Accordingly, the process steps and applicable materials may not be repeated herein. FIG. 12 shows that fins 52B and 52C may be spaced apart from each other such that the fourth fin pitch P4 of the fins 52B and 52C is larger than the first fin pitch P1 and the third fin pitch P3. The initial steps of this embodiment are the same as shown in FIGS. 1 through 5. The dielectric layer 59 is deposited over the dielectric layer 58 such that the dielectric layer 59 is disposed along sidewalls and top surfaces of the dielectric layer 58. In an embodiment, the dielectric layer 59 may have a fourth thickness T4, which may be in a range from 1 nm to 5 nm. The dielectric layer 60 is then deposited over the dielectric layer 59 such that the dielectric layer 60 is disposed along sidewalls and top surfaces of the dielectric layer 59. The deposition of the dielectric layer 60 may be performed using a conformal deposition process, such as, CVD, ALD, or the like. In an embodiment, the dielectric layer 60 may have a fifth thickness T5, which may be in a range from 2 nm to 10 nm. In an embodiment, the fourth thickness T4 and the fifth thickness T5 may be the same. In an embodiment, the fourth thickness T4 is smaller than the fifth thickness T5.

After the deposition of the dielectric layer 60, a dielectric layer 63 is deposited over the dielectric layer 58, the dielectric layer 59 and the dielectric layer 60. The dielectric layer 63 may be deposited between some of the fins 52 to fill or overfill areas between the fins 52 (e.g., between the fins 52B and 52C). The deposition of the dielectric layer 63 may be performed using a flowable-chemical vapor deposition (FCVD) process, or the like. The dielectric layer 63 between some of the fins 52 (e.g., the fins 52B and 52C) may be deposited until it fills a remaining space between adjacent fins 52. In an embodiment, the dielectric layer 63 comprises SiCN, SiN, SiCO, or the like. In an embodiment a third width W3 of portions of the dielectric layer 63, the dielectric layer 60 and the dielectric layer 59 between adjacent fins 52 (e.g., the fins 52B and 52C) is in a range from 10 nm to 30 nm. In an embodiment in which the fourth fin pitch P4 of the fins 52B and 52C is larger than the third fin pitch P3, the third width W3 is larger than the first width W1 and the first width W1. In an embodiment, the dielectric layer 59 and the dielectric layer 60 may comprise the same material. In an embodiment, the dielectric layer 59 may have a greater percentage atomic carbon concentration than a percentage atomic carbon concentration of the dielectric layer 60.

In FIG. 13, a planarization (e.g., a chemical mechanical polish (CMP)) and/or etch back process (e.g., a dry etching process) is used to expose upper surfaces of the fins 52. In particular, upper portions of the dielectric layer 63, the dielectric layer 60, the dielectric layer 59, the dielectric layer 58, the dielectric layer 56, and the mask layer 54 are removed so that fins 52 are exposed. In some embodiments, exposing the fins 52 results in upper surfaces of the dielectric layer 63, the dielectric layer 60, the dielectric layer 59, the dielectric layer 58, the dielectric layer 56, and the fins 52 being substantially coplanar.

Still referring to FIG. 13, a recess is formed in the dielectric layer 63. Forming the recess may be achieved by using any acceptable photolithographic masking and etching techniques) or other etching processes (e.g., selectively etching the dielectric layer 63 using a dry/wet etch process) used to remove an upper portion of the dielectric layer 63.

In some embodiments, after forming the recess, a top surface of the dielectric layer 63 is lower than top surfaces of the dielectric layer 60, the dielectric layer 59, the dielectric layer 58, the dielectric layer 56, and the fins 52.

After the formation of the recess in the dielectric layer 63, a dielectric layer 65 is then deposited over the patterned photoresist or other masks (not shown). The dielectric layer 65 fills the recess in the dielectric layer 63. The deposition of the dielectric layer 65 may be performed using CVD, ALD, or the like. In an embodiment, the dielectric layer 65 comprises SiCN, SiN, SiCO, or the like. After the formation of the dielectric layer 65, a planarization (e.g., a chemical mechanical polish (CMP)) is used to remove the photoresist and excess portions of the dielectric layer 65. After the planarization, top surfaces of the dielectric layer 65, the dielectric layer 60, the dielectric layer 59, the dielectric layer 58 and the dielectric layer 56 are substantially coplanar. In an embodiment, the top surface of the dielectric layer 63 is lower than top surfaces of the dielectric layer 65, the dielectric layer 60, the dielectric layer 59, the dielectric layer 58, the dielectric layer 56, and the fins 52.

In FIG. 14, an additional etch back process (e.g., similar to the additional etch back process described previously in FIGS. 8A and 11A) is then performed on the dielectric layer 56 and the dielectric layer 58 of FIG. 13. The dielectric layer 56 and the dielectric layer 58 are recessed such that portions of fins 52 and dummy fins 36 protrude above top surfaces of the dielectric layer 56 and the dielectric layer 58. In some embodiments, after recessing, a height of the fins 52 may be substantially the same as a height of the dummy fins 36. Each of the dummy fins 36 is made of the dielectric layer 65, the dielectric layer 59, the dielectric layer 60 and the dielectric layer 63, and may comprise a first portion which extends above a top surface of the dielectric layer 56 and the dielectric layer 58, and a second portion below the top surface of the dielectric layer 56. Thus, the dummy fins 36 may have a different material composition than fins 52, and the dummy fins 36 may be insulating fins. The dielectric layer 56, the dielectric layer 58, and second portions of the dummy fins 36 (referred to collectively as isolation region 64) provide electrical isolation between adjacent fins 52 and may further provide shallow trench isolation (STI) regions between the fins 52 such that a separate STI region need not be formed. In an embodiment, an entirety of the dielectric layer 65 is above a top surface of the dielectric layer 56. Each of the dummy fins 36 may have the third width W3. In an embodiment, a fourth width W4 of the dielectric layer 63 is the same as a fifth width W5 of the dielectric layer 65.

After the etch back process is performed, appropriate wells (not shown) may be formed in the fins 52 and/or the substrate 50 in a manner similar to that as described previously in FIG. 8A.

Advantages can be achieved as a result of the formation of the dummy fins 36 comprising the dielectric layer 59 and the dielectric layer 60, which include SiCN having a carbon concentration that is in a range from 15 percent to 25 percent by weight of carbon. These include the dummy fins 36 having a better etch resistance to the etch back process. This results in reduced dummy fin 36 damage during the etch back process, and less dielectric film loss. This reduces the risk of shorting subsequently formed epitaxial source/drain regions 82 (e.g., shown subsequently in FIGS. 18C and 18D) of adjacent fins 52, and lowers the risk of performance degradation. In addition, the etch resistance and dielectric film loss reduction is especially significant for dummy fins 36 having a third width W3 that is less than 11 nm.

Other advantages can be achieved a result of the formation of the dummy fins 36 comprising the dielectric layer 59 and the dielectric layer 60, which include SiCN having a silicon concentration that is in a range from 45 percent to 50 percent by weight of silicon. These include the dummy fins 36 having a tensile stress and therefore being able to better anchor subsequently formed dummy gates 72 (shown subsequently in FIGS. 16A and 16B).

Figure 15B:
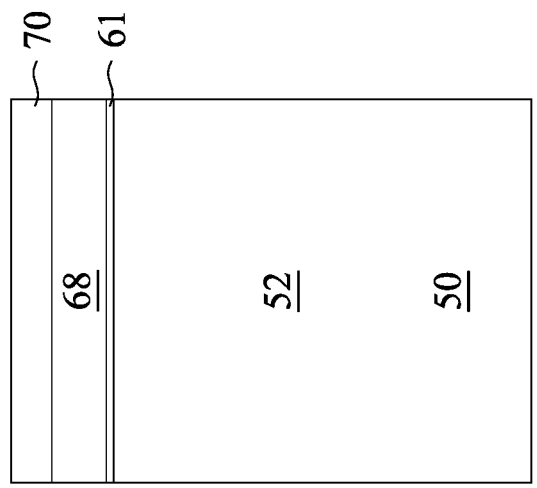
Figure 15A:
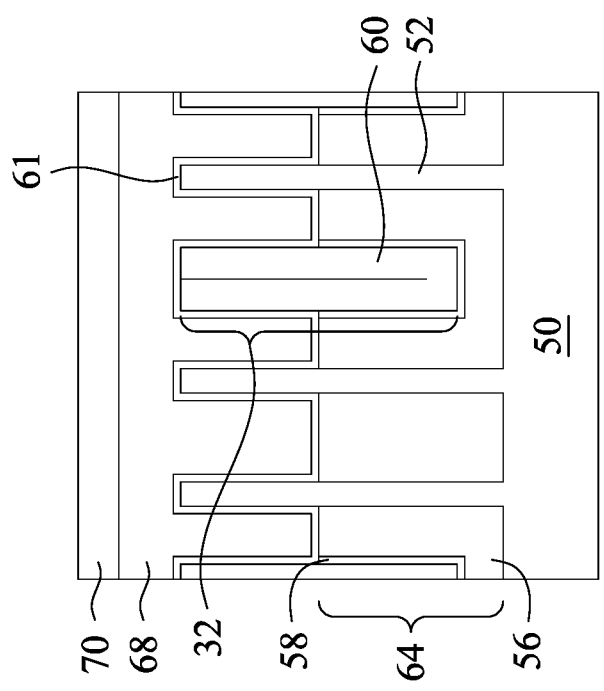

In FIGS. 15A and 15B, a continuation of the manufacturing process is illustrated, in which a dummy dielectric layer 61 is formed on the fins 52, the dielectric layer 56, and the dummy fins 32 (or the dummy fins 34/36 depending on the embodiment). The embodiment shown in FIGS. 15A and 15B (and subsequently discussed embodiments) may be applied to any of the previously described embodiments of FIGS. 8A, 8D, 11A, 11B, and 14 (for example, embodiments that describe the dummy fins 34 and the dummy fins 36. FIG. 15A illustrates a cross-sectional view taken along line A-A of FIG. 1; FIG. 15B illustrates a cross-sectional view taken along line C-C of FIG. 1. The dummy dielectric layer 61 may be, for example, silicon oxide, silicon nitride, a combination thereof, or the like, and may be deposited or thermally grown according to acceptable techniques. For example, the dummy dielectric layer 61 may be deposited on the fins 52, the dielectric layer 56, and the dummy fins 32 using ALD, CVD, or the like. In other embodiments, (not illustrated) the dummy dielectric layer 61 may be formed using an embodiment thermal oxidation process where the dummy dielectric layer 61 is selectively grown on the fins 52 without being grown on the dummy fins 32 and the dielectric layer 56. Dummy gate layer 68 is formed over the dummy dielectric layer 61, and a mask layer 70 is formed over the dummy gate layer 68. The dummy gate layer 68 may be deposited over the dummy dielectric layer 61 and then planarized, such as by a CMP. The mask layer 70 may be deposited over the dummy gate layer 68. The dummy gate layer 68 may be formed from a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 68 may be deposited by physical vapor deposition (PVD), CVD, sputter deposition, or other techniques known and used in the art for depositing conductive materials. The dummy gate layer 68 may be made of other materials that have a high etching selectivity from the etching of isolation regions. The mask layer 70 may include, for example, SiN, SiON, or the like. In this example, a single dummy gate layer and a single mask layer are formed across the region 50C and the region 50D (see FIG. 2). In some embodiments, separate dummy gate layers may be formed in the region 50C and the region 50D, and separate mask layers may be formed in the region 50C and the region 50D.

FIGS. 16A through 22B illustrate various additional steps in the manufacturing of embodiment devices. FIGS. 16A through 22B illustrate features in either of the region 50C and the region 50D. For example, the structures illustrated in FIGS. 16A through 22B may be applicable to both the region 50C and the region 50D. Differences (if any) in the structures of the region 50C and the region 50D are described in the text accompanying each figure.

Figure 16B:
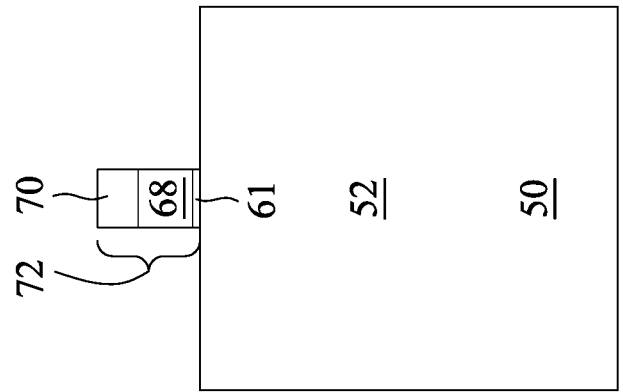
Figure 16A:
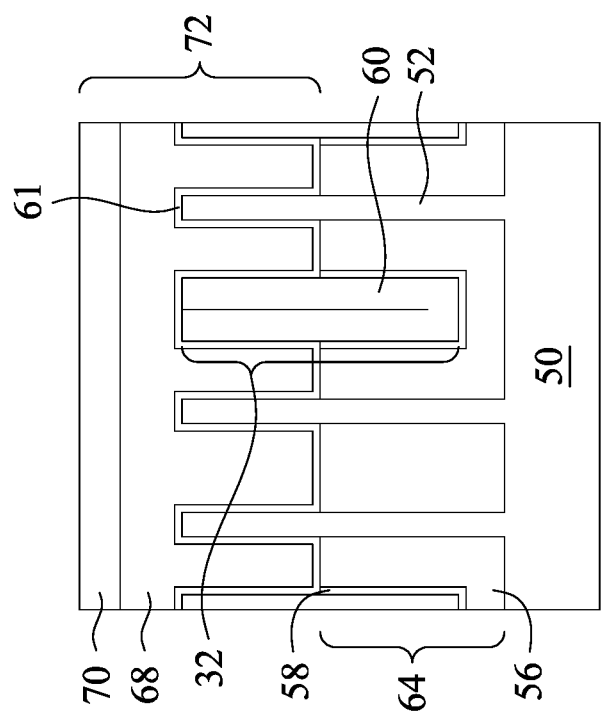

In FIGS. 16A and 16B, the mask layer 70 may be patterned using acceptable photolithography and etching techniques to form masks 70. The pattern of the masks 70 then may be transferred to the dummy gate layer 68 (e.g., to form dummy gate electrodes 68) and the dummy dielectric layer 61 by an acceptable etching technique to form dummy gates 72. The dummy gates 72 cover respective channel regions of the fins 52. The pattern of the masks 70 may be used to physically separate each of the dummy gates 72 from adjacent dummy gates. The dummy gates 72 may also have a lengthwise direction substantially perpendicular to the lengthwise direction of respective fins 52 and the dummy fins 32. Further, the dummy fins 32 may provide additional structural support for the dummy gates 72 formed over and along sidewalls of the dummy fins 32.

Further, gate seal spacers (not explicitly illustrated) can be formed on exposed surfaces of the dummy gates 72, the masks 70, and/or the fins 52. A thermal oxidation or a deposition followed by an anisotropic etch may form the gate seal spacers.

After the formation of the gate seal spacers, implants for lightly doped source/drain (LDD) regions (not explicitly illustrated) may be performed. In the embodiments with different device types, similar to the implants discussed above in FIG. 8, a mask, such as a photoresist, may be formed over the region 50C, while exposing the region 50D, and appropriate type (e.g., n-type or p-type) impurities may be implanted into the exposed fins 52 in the region 50D. The mask may then be removed. Subsequently, a mask, such as a photoresist, may be formed over the region 50D while exposing the region 50C, and appropriate type impurities may be implanted into the exposed fins 52 in the region 50C. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $cm^{-3}$ to about $10^{16}$ $cm^{-3}$. An anneal may be used to activate the implanted impurities.

Figure 17B:
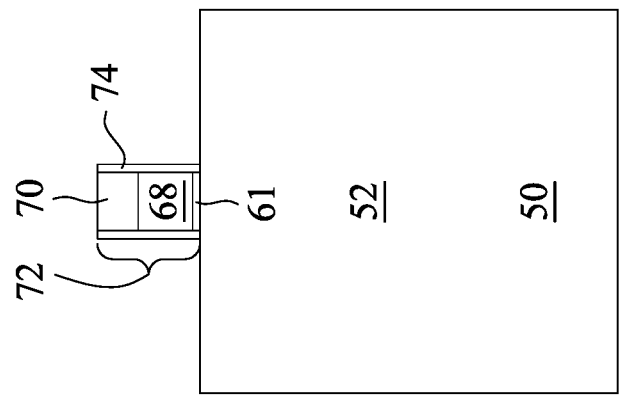
Figure 17A:
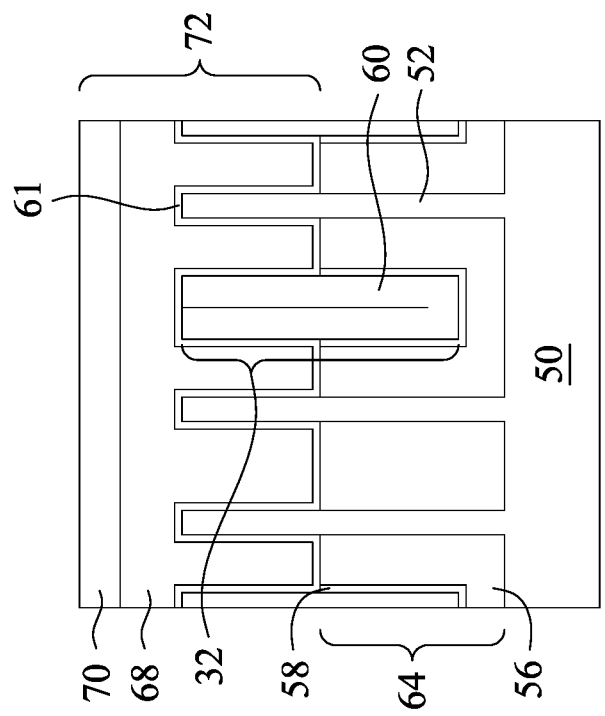

In FIGS. 17A and 17B, gate spacers 74 are formed on the gate seal spacers (not explicitly illustrated) along sidewalls of the dummy gates 72. The gate spacers 74 may be formed by conformally depositing a material and subsequently anisotropically etching the material. The material of the gate spacers 74 may be silicon nitride, SiCN, a combination thereof, or the like.

Figure 18B:
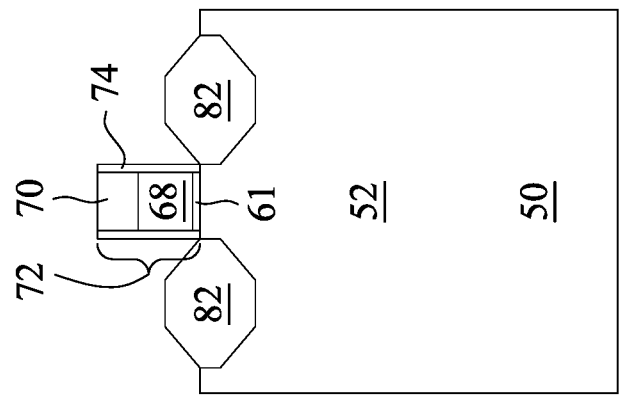
Figure 18A:
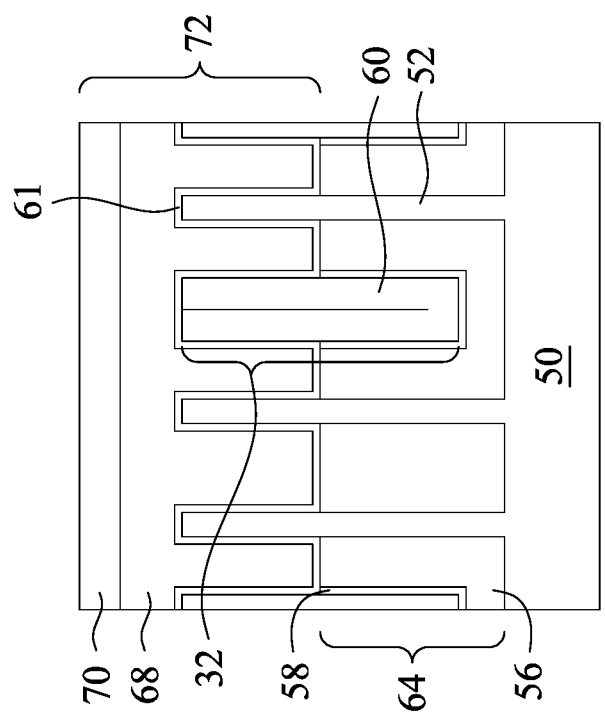
Figure 18D:
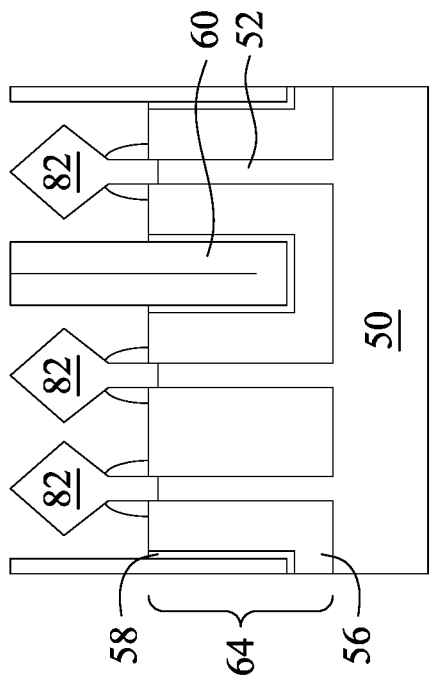
Figure 18C:
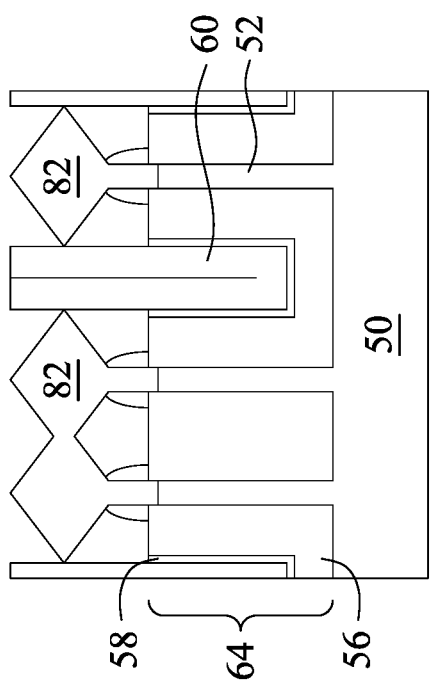

In FIGS. 18A and 18B, epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments that epitaxial source/drain regions 82 may extend into the fins 52. In some embodiments, the gate spacers 74 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions of the fins 52, thereby improving performance.

Referring to FIGS. 18A and 18B, portions of the fins 52 are etched, such as portions of the fins 52 that are not masked by the dummy gates 72. Recessing the fins 52 may use a selective etch process which etches the fins 52 without significantly etching the dummy gates 72 or the dummy fins 32. In various embodiments, the fins 52 may be recessed separately in the regions 50C and 50D, for example, while the other region is masked.

The epitaxial source/drain regions 82 in the region 50C, e.g., the NMOS region, may be formed by masking the region 50D, e.g., the PMOS region, and etching source/drain regions of the fins 52 in the region 50C to form recesses in the fins 52. Then, the epitaxial source/drain regions 82 in the region 50C are epitaxially grown in the recesses. The epitaxial source/drain regions 82 may include any acceptable material, such as appropriate for n-type FinFETs. For example, if the fin 52 is silicon, the epitaxial source/drain regions 82 in the region 50C may include silicon, SiC, SiCP, SiP, or the like. The epitaxial source/drain regions 82 in the region 50C may have surfaces raised from respective surfaces of the fins 52 and may have facets. In some embodiments, the dummy fins 32 provide physical separation between adjacent ones of the epitaxial source/drain regions 82 in the region 50C and prevent merging of adjacent epitaxial source/drain regions 82 in the region 50C during epitaxy.

The epitaxial source/drain regions 82 in the region 50D, e.g., the PMOS region, may be formed by masking the region 50C, e.g., the NMOS region, and etching source/drain regions of the fins 52 in the region 50D to form recesses in the fins 52. Then, the epitaxial source/drain regions 82 in the region 50D are epitaxially grown in the recesses. The epitaxial source/drain regions 82 may include any acceptable material, such as appropriate for p-type FinFETs. For example, if the fin 52 is silicon, the epitaxial source/drain regions 82 in the region 50D may comprise SiGe, SiGeB, Ge, GeSn, or the like. The epitaxial source/drain regions 82 in the region 50D may also have surfaces raised from respective surfaces of the fins 52 and may have facets. In some embodiments, the dummy fins 32 provide physical separation between adjacent ones of the epitaxial source/drain regions 82 in the region 50D and prevents merging of adjacent epitaxial source/drain regions 82 in the region 50D during epitaxy.

The epitaxial source/drain regions 82 and/or the fins 52 may be implanted with dopants to form source/drain regions, similar to the process previously discussed for forming lightly doped source/drain regions, followed by an anneal. The source/drain regions may have an impurity concentration of between about $10^{19}$ $cm^{-3}$ and about $10^{21}$ $cm^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50C and the region 50D, upper surfaces of the epitaxial source/drain regions 82 have facets which expand laterally outward beyond a sidewalls of the fins 52. The upper surfaces of the epitaxial source/drain regions 82 may contact sidewalls of the dummy fins 32, and the dummy fins 32 disposed between adjacent epitaxial source/drain regions 82 may prevent the adjacent epitaxial source/drain regions 82 from merging. As a result of forming the dummy fin 32 with at least one dielectric film (e.g., dielectric layer 60) that is carbon doped and comprises a carbon concentration that is in a range from 15 percent to 25 percent by weight of carbon, and/or comprises a silicon concentration that is in a range from 45 percent to 50 percent by weight of silicon, the dummy fin 32 has a better etch resistance to an etch back process (described in in FIG. 8A). This results in lower dummy fin 32 damage during the etch back process and less dielectric film loss, and allows the dummy fins 32 to better prevent adjacent epitaxial source/drain regions 82 from merging. This reduces the risk of shorting the epitaxial source/drain regions 82, and lowers the risk of performance degradation In some embodiments, the facets cause adjacent epitaxial source/drain regions 82 to merge as illustrated by FIG. 18C. In other embodiments, adjacent epitaxial source/drain regions 82 remain separated after the epitaxy process is completed as illustrated by FIG. 18D. The epitaxial source/drain regions 82 formed in the fins 52 may be merged, as illustrated in FIG. 18C, or separated, as illustrated in FIG. 18D.

Figure 19B:
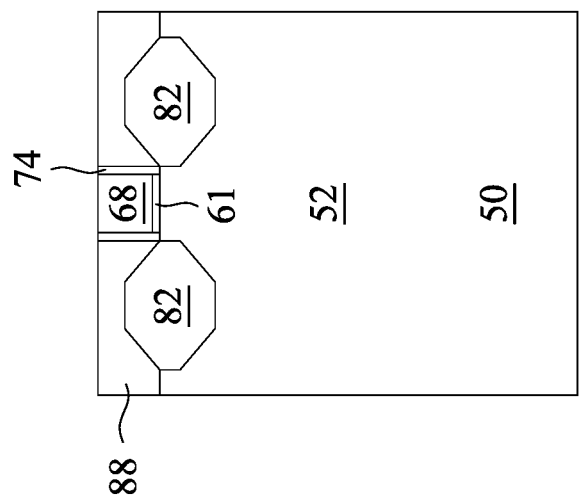
Figure 19A:
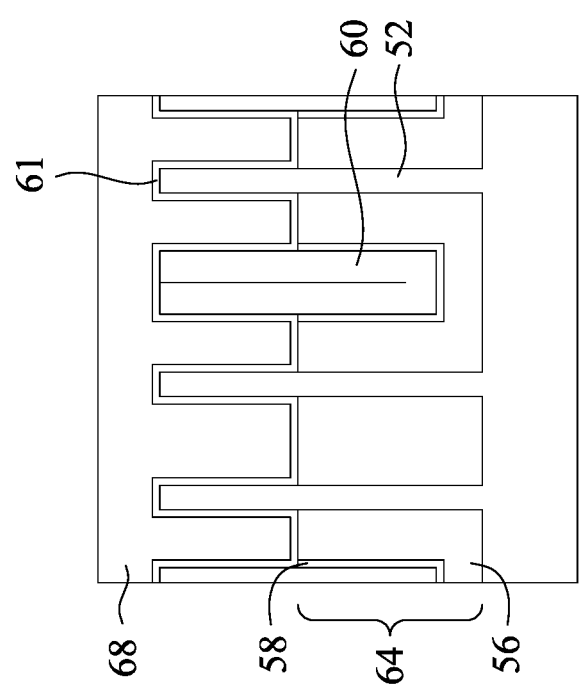
Figure 19D:
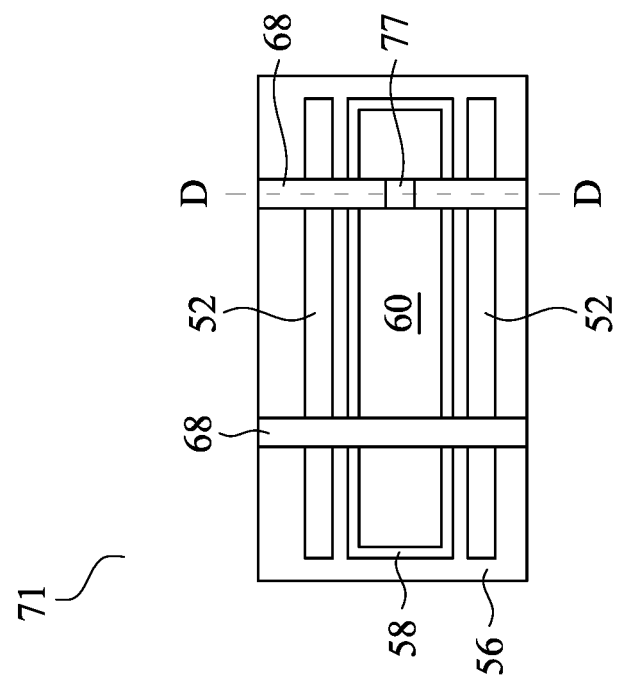
FIG. 19D is a top-down view of an intermediate stage in the manufacturing of FinFETs, in accordance with some embodiments.

In FIGS. 19A and 19B, an ILD 88 is deposited over the structure illustrated in FIGS. 18A and 18B. The ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL), not illustrated, is disposed between the ILD 88 and the epitaxial source/drain regions 82, the mask 70, and the gate spacers 74.

Subsequently, a planarization process, such as a CMP, may be performed to level the top surface of the ILD 88 with the top surfaces of the dummy gate electrodes 68. The planarization process may also remove the masks 70 on the dummy gate electrodes 68, and portions of the gate seal spacers and the gate spacers 74 along sidewalls of the masks 70. After the planarization process, top surfaces of the dummy gate electrodes 68, the gate spacers 74, and the ILD 88 are level. Accordingly, the top surfaces of the dummy gate electrodes 68 are exposed through the ILD 88.

Figure 19C:
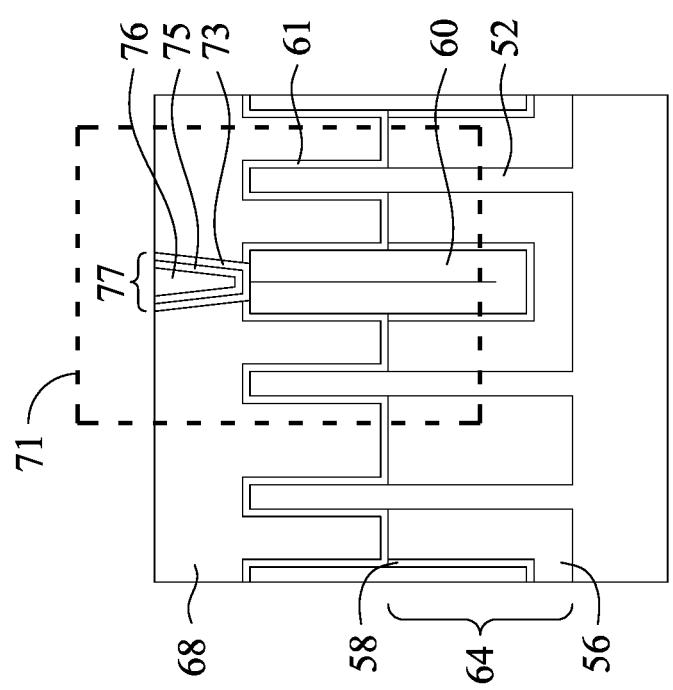

FIGS. 19C and 19D illustrate the formation of an optional dummy structure 77 extending through the dummy gate electrodes 68 and the dummy dielectric layer 61, after the formation of the ILD 88 and the planarization process (described previously in FIGS. 19A and 19B) is performed. Unless specified otherwise, like reference numerals in this embodiment (and subsequently discussed embodiments) represent like components in the embodiment shown in FIGS. 1 through 19B formed by like processes. Accordingly, the process steps and applicable materials may not be repeated herein. FIG. 19C is illustrated along reference cross-section D-D illustrated in FIG. 19D. In FIG. 19C, the optional dummy structure 77 is formed through the dummy gate electrodes 68 and the dummy dielectric layer 61 that were shown in FIGS. 19A and 19B. An opening for the dummy structure 77 (not separately illustrated) is formed through the dummy gate electrodes 68 and the dummy dielectric layer 61 such that a top surface of the dummy fin 32 is exposed. The opening may be formed using acceptable photolithography and etching techniques.

Further referring to FIG. 19C, a high-k dielectric layer 73 is deposited over the ILD 88, the dummy gate electrodes 68 and in the opening in the dummy gate electrodes 68 and the dummy dielectric layer 61. The high-k dielectric layer 73 may have a k value greater than about 7.0, and may include a metal oxide or a silicate of Hf, Al, Zr, La, Mg, Ba, Ti, Pb, and combinations thereof. The high-k dielectric layer overlies, and may physically contact, the dummy fin 32. The high-k dielectric layer 73 is formed as a conformal layer, and extends on the sidewalls and a bottom surface of the opening. In accordance with some embodiments of the present disclosure, the high-k dielectric layer 73 is formed using ALD, CVD, or the like.

After the deposition of the high-k dielectric layer 73, a work function tuning layer 75 is then formed conformally on the high-k dielectric layer 73. The work function tuning layer 75 may be any acceptable material to tune a work function of a device to a desired amount given the application of the device to be formed, and may be deposited using any acceptable deposition process. In some embodiments, the work function tuning layer 75 may comprise titanium nitride (TiN), tantalum nitride (TaN), titanium aluminum nitride (TiAlN), titanium aluminum carbide (TiAlC, TiAl), or the like deposited by ALD, CVD, PVD, or the like. In an embodiment, the work function tuning layer 75 may comprise two or more different materials.

After the deposition of the work function tuning layer 75, an insulating material 76 is formed over the work function tuning layer 75 in order to fill in the opening. The insulating material 76 may comprise SiCN, SiN, or the like, formed using ALD, CVD, or the like. A planarization process, such as a CMP, may be performed to remove excess material from a surface of the ILD 88 and the dummy gate electrodes 68. The remaining high-k dielectric layer 73, work function tuning layer 75, and the insulating material 76 form the dummy structure 77 in the opening. In an embodiment, the dummy structure 77 may function as a dummy contact that is not electrically connected to any overlying conductive lines.

FIG. 19D illustrates a top-down view of a region 71 of FIG. 19C with certain structures such as the ILD 88 and the epitaxial source/drain regions 82 removed for purposes of clarity. FIG. 19D shows the dummy gate electrodes 68 over the fins 52 and the dummy fin 32. As illustrated, the fins 52 are surrounded by insulating materials (e.g., a combination of the dielectric layer 56, the dielectric layer 58, and the dielectric layer 60 for the case when dummy fin 32 comprises the dielectric layer 60). Further, a portion of the dummy fins 32, may be surrounded by the dielectric layer 58 and the dielectric layer 56. FIG. 19D further shows the dummy structure 77 over the dummy fin 32, and extending through the dummy gate electrode 68 and the dummy dielectric layer 61.

Figure 20B:
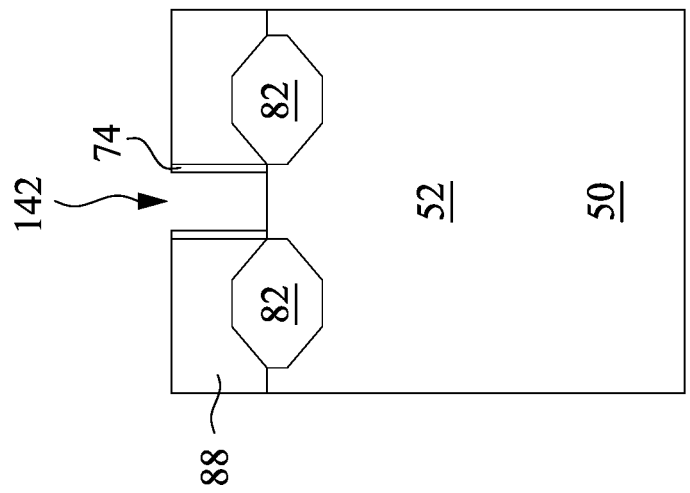
FIGS. 20A, 20B, 21A, 21B and 21C are cross-sectional views of intermediate stages in the manufacturing of FinFETs, in accordance with some embodiments.
Figure 20A:
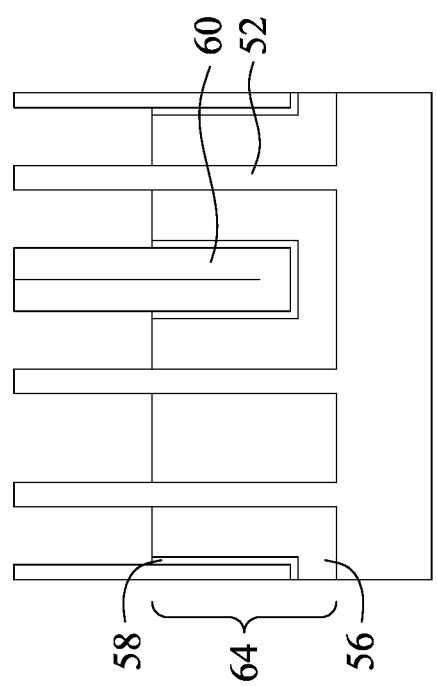

In FIGS. 20A and 20B, the dummy gate electrodes 68 and portions of the dummy dielectric layer 61 directly underlying the exposed dummy gate electrodes 68 are removed in an etching step(s), so that recesses 142 are formed. In some embodiments, the dummy gate electrodes 68 are removed by an anisotropic dry etch process. For example, the etching process may include a dry etch process using reaction gas(es) that selectively etch dummy gate electrodes 68 without etching the ILD 88 or the gate spacers 74. Each recess 142 exposes a channel region of a respective fin 52. Each channel region is disposed between neighboring pairs of the epitaxial source/drain regions 82. During the removal, the dummy dielectric layer 61 may be used as an etch stop layer when the dummy gate electrodes 68 are etched. The dummy dielectric layer 61 may then be removed after the removal of the dummy gate electrodes 68.

Figure 21B:
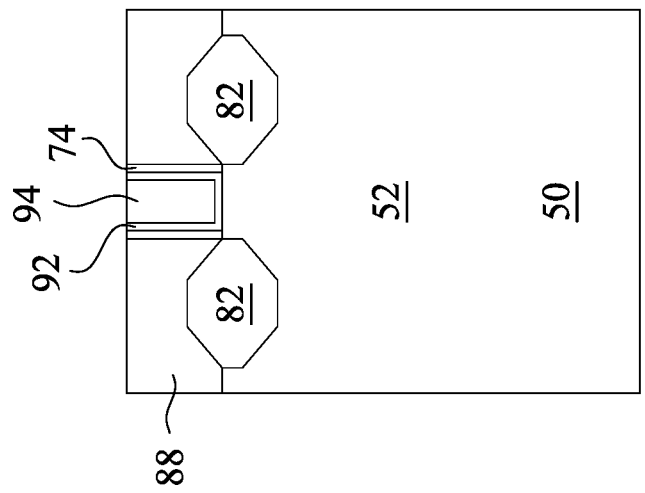
Figure 21A:
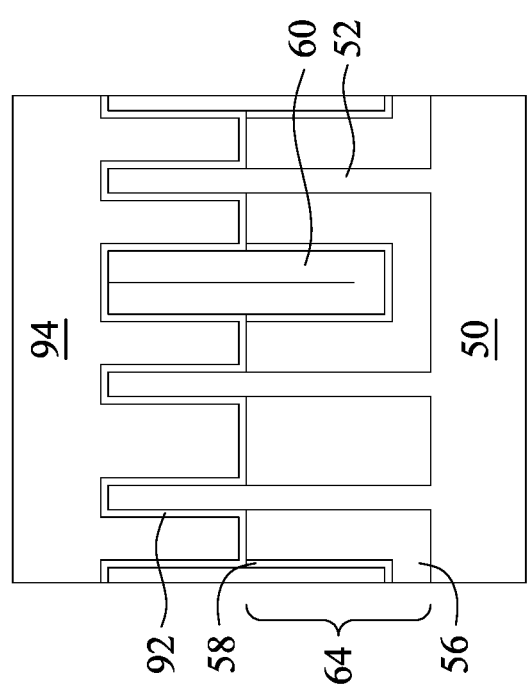
Figure 21D:
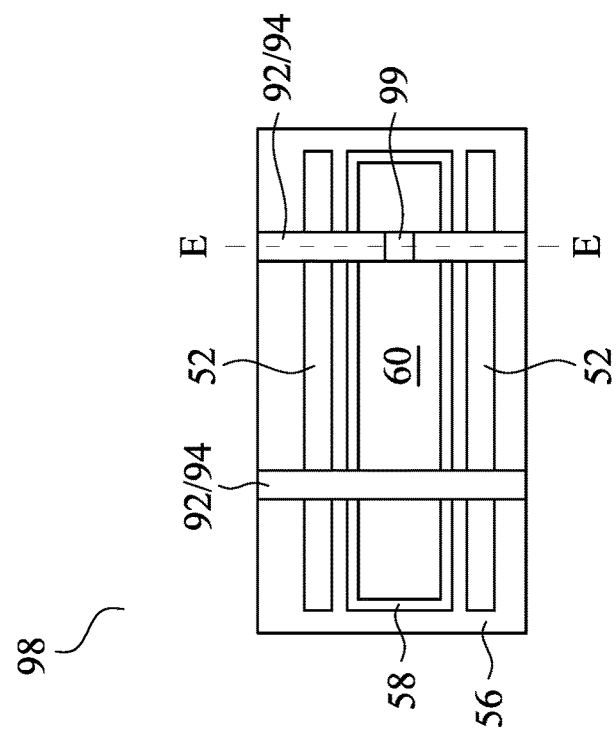
FIG. 21D is a top-down view of an intermediate stage in the manufacturing of FinFETs, in accordance with some embodiments.

In FIGS. 21A and 21B, gate dielectric layers 92 and gate electrodes 94 are formed for replacement gates. Gate dielectric layers 92 are deposited conformally in the recesses 142, such as on the top surfaces of the fins 52 and the dummy fins 32, and on sidewalls of the fins 52, the dummy fins 32, and the gate seal spacers. The gate dielectric layers 92 may also be formed on top surface of the ILD 88. In an embodiment, the gate dielectric layers 92 may be in physical contact with a top surface of the dielectric layer 58 and the dielectric layer 56. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like.

The gate electrodes 94 are deposited over the gate dielectric layers 92, respectively. The gate electrodes 94 may be a metal-containing material such as TiN, TaN, TaC, Co, Ru, Al, combinations thereof, or multi-layers thereof. For example, although a single gate electrode 94 is illustrated, any number of work function tuning layers may be deposited in the recesses 142. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate" or a "gate stack." The gate and the gate stacks may extend along sidewalls of a channel region of the fins 52 and along sidewalls of the dummy fins 32.

The formation of the gate dielectric layers 92 in the region 50C and the region 50D may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

Figure 21C:
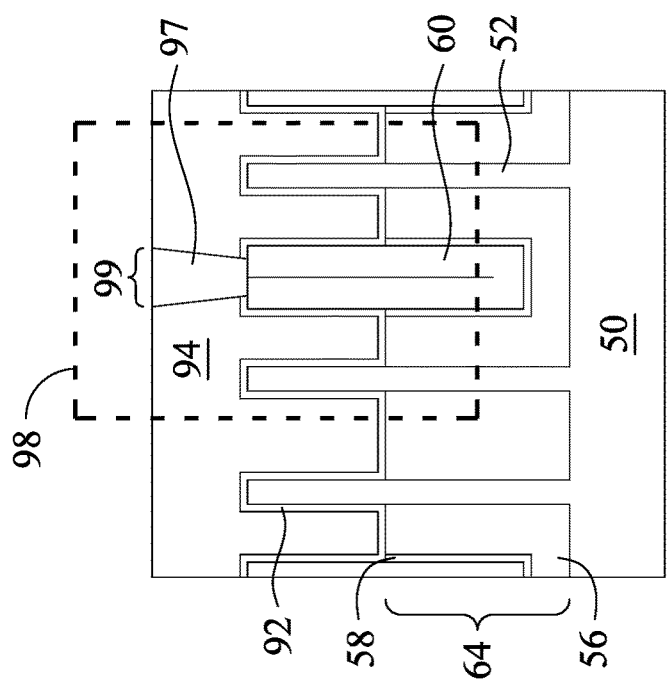
Figure 21F:
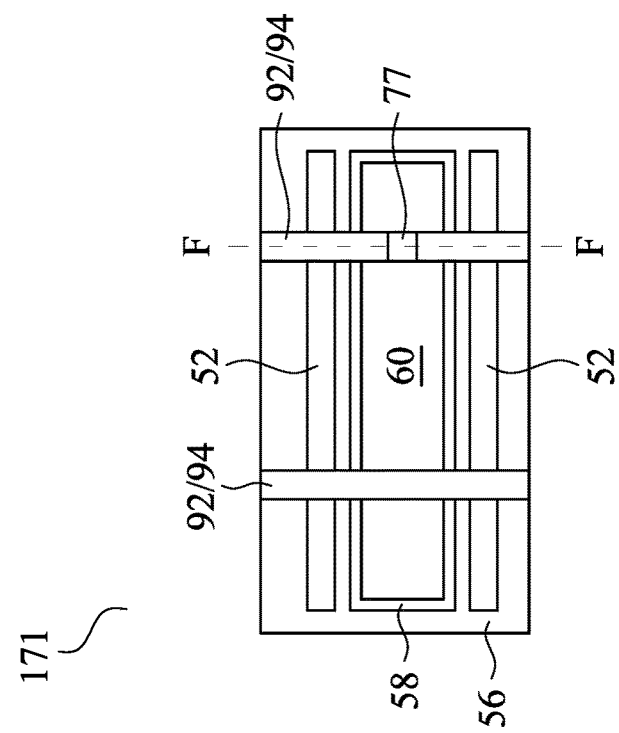
FIG. 21F is a top-down view of an intermediate stage in the manufacturing of FinFETs, in accordance with some embodiments.

FIGS. 21C and 21D illustrate the formation of an optional dummy structure 99 extending through the gate electrodes 94 and the gate dielectric layers 92, in accordance with various embodiments. Unless specified otherwise, like reference numerals in this embodiment (and subsequently discussed embodiments) represent like components in the embodiment shown in FIGS. 1 through 21B formed by like processes. Accordingly, the process steps and applicable materials may not be repeated herein. FIG. 21C is illustrated along reference cross-section E-E illustrated in FIG. 21D. In FIG. 21C, an opening (not separately illustrated) for the dummy structure 99 is formed through the gate electrodes 94 and the gate dielectric layers 92 such that a top surface of the dummy fin 32 is exposed. The opening may be formed using acceptable photolithography and etching techniques.

Further referring to FIG. 21C, an insulating material 97 is formed over the gate electrodes 94 and in the opening in order to fill in the opening. The insulating material 76 may comprise SiCN, SiN, or the like, formed using ALD, CVD, or the like. A planarization process, such as a CMP, may be performed to remove excess material from a surface of the ILD 88 and the gate electrodes 94. The remaining insulating material 97 forms the dummy structure 99 in the opening. In an embodiment, the dummy structure 99 may function as a dummy contact that is not electrically connected to any overlying conductive lines.

FIG. 21D illustrates a top-down view of a region 98 of FIG. 21C with certain structures such as the ILD 88 and the epitaxial source/drain regions 82 removed for purposes of clarity. The FIG. 21D shows the gate electrodes 94 over the fins 52 and the dummy fin 32. As illustrated, the fins 52 are surrounded by insulating materials (e.g., a combination of the dielectric layer 56, the dielectric layer 58, and the dielectric layer 60 for the case when dummy fin 32 comprises the dielectric layer 60). Further, a portion of the dummy fins 32 may be surrounded by the dielectric layer 58 and the dielectric layer 56. FIG. 21D further shows the dummy structure 99 over the dummy fin 32, and extending through the gate electrodes 94 and the gate dielectric layers 92.

Figure 21E:
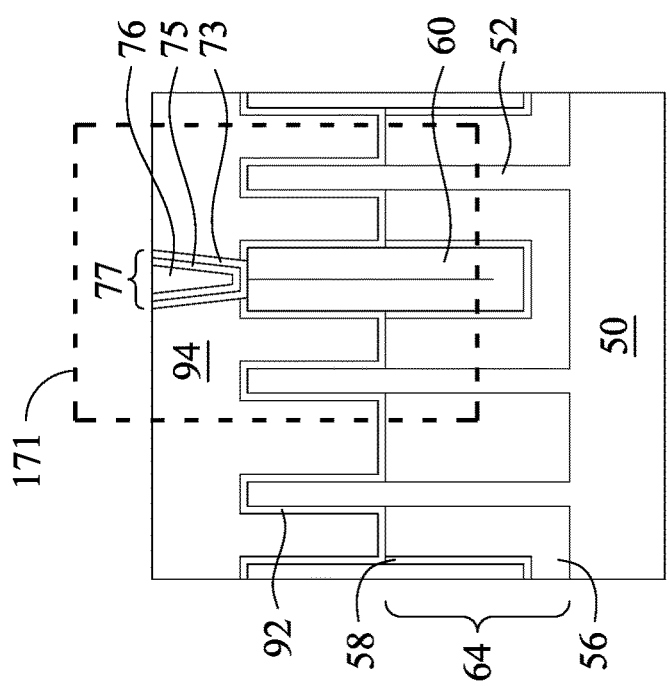
FIG. 21E is a cross-sectional view of an intermediate stage in the manufacturing of FinFETs, in accordance with some embodiments.

FIGS. 21E and 21F illustrate the optional dummy structure 77 of the alternate embodiment described previously in FIGS. 19C and 19D, where the optional dummy structure 77 extends through the gate electrodes 94 and the gate dielectric layers 92, in accordance with various embodiments. Unless specified otherwise, like reference numerals in this embodiment (and subsequently discussed embodiments) represent like components in the embodiment shown in FIGS. 1 through 21D formed by like processes. Accordingly, the process steps and applicable materials may not be repeated herein. FIG. 21E is illustrated along reference cross-section F-F illustrated in FIG. 21F.

FIG. 21F illustrates a top-down view of a region 171 of FIG. 21E with certain structures such as the ILD 88 and the epitaxial source/drain regions 82 removed for purposes of clarity. The FIG. 21F shows the gate electrodes 94 over the fins 52 and the dummy fin 32. As illustrated, the fins 52 are surrounded by insulating materials (e.g., a combination of the dielectric layer 56, the dielectric layer 58, and the dielectric layer 60 for the case when dummy fin 32 comprises the dielectric layer 60). Further, a portion of the dummy fins 32 may be surrounded by the dielectric layer 58 and the dielectric layer 56. FIG. 21F further shows the dummy structure 77 over the dummy fin 32, and extending through the gate electrodes 94 and the gate dielectric layers 92.

Figure 22B:
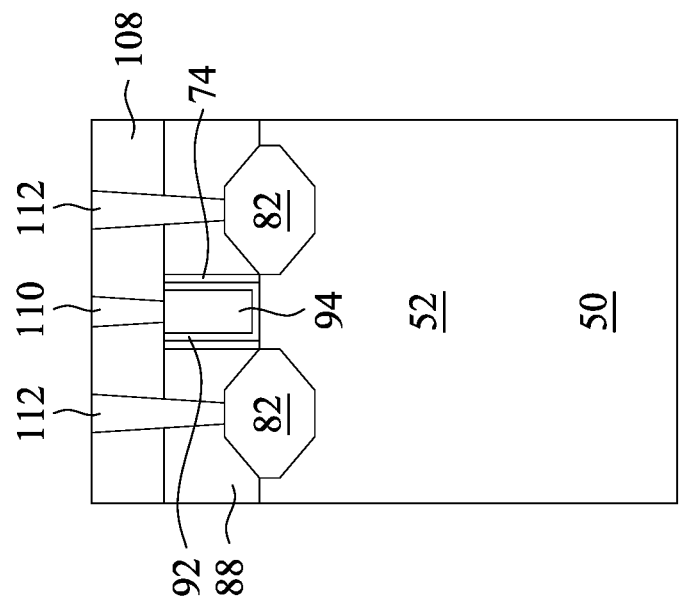
FIGS. 22A and 22B are cross-sectional views of intermediate stages in the manufacturing of FinFETs, in accordance with some embodiments.
Figure 22A:
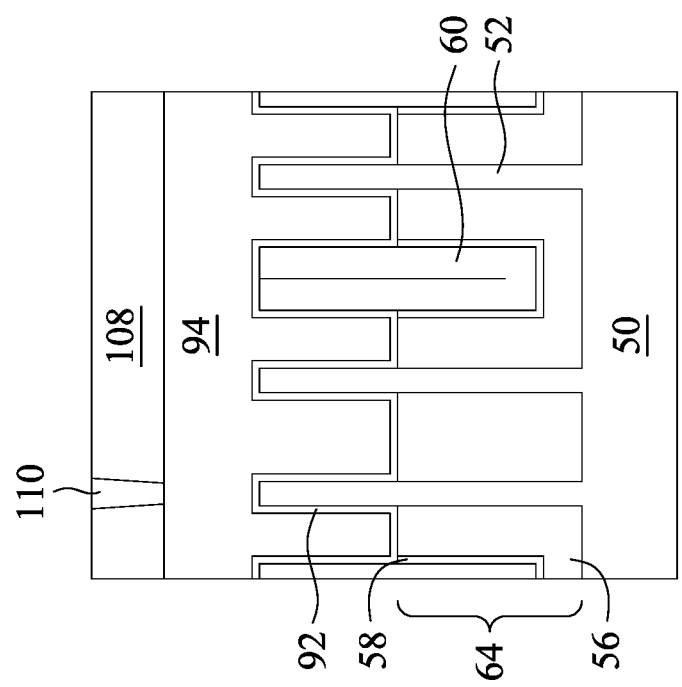

In FIGS. 22A and 22B, an ILD 108 is deposited over the ILD 88, the gate electrodes 94, the gate dielectric layers 92, and the gate spacers 74. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD. Gate contact 110 and source/drain contacts 112 are formed through the ILD 108 and the ILD 88. Openings for the source/drain contacts 112 (not separately illustrated) are formed through the ILD 108 and the ILD 88, and openings for the gate contact 110 (not separately illustrated) are formed through the ILD 108 and the conductive layer 106. The openings may be formed using acceptable photolithography and etching techniques. In some embodiments, an anneal process may be performed to form a silicide at the interface between the epitaxial source/drain regions 82 and the source/drain contacts 112 prior to the source/drain contacts 112 being formed.

The gate contact 110 and the source/drain contacts 112 may be formed of conductive materials such as Al, Cu, W, Co, Ti, Ta, Ru, TiN, TiAl, TiAlN, TaN, TaC, NiSi, CoSi, combinations of these, or the like, although any suitable material may be used. The material of the gate contact 110 and the source/drain contacts 112 may be deposited into the openings in the ILD 108 and the ILD 88 using a deposition process such as sputtering, chemical vapor deposition, electroplating, electroless plating, or the like, to fill and/or overfill the openings. Once filled or overfilled, any deposited material outside of the openings may be removed using a planarization process such as chemical mechanical polishing (CMP).

The gate contact 110 is physically and electrically connected to the gate electrode 94, and the source/drain contacts 112 are physically and electrically connected to the epitaxial source/drain regions 82. FIG. 22B illustrates the gate contact 110 and the source/drain contacts 112 in a same cross-section; however, in other embodiments, the gate contacts 110 and the source/drain contacts 112 may be disposed in different cross-sections. Further, the position of the gate contacts 110 and the source/drain contacts 112 in FIGS. 22A and 22B are merely illustrative and not intended to be limiting in any way. For example, the gate contact 110 may be vertically aligned with the fin 52 as illustrated or may be disposed at a different location above the gate electrode 94. Furthermore, the source/drain contacts 112 may be formed prior to, simultaneously with, or after forming the gate contact 110.

The embodiments of the present disclosure have some advantageous features. The embodiments include the formation of a dummy fin with at least one dielectric film that is carbon doped and/or comprises a high silicon percentage by weight of the dielectric film. As a result, the dummy fin has better etch resistance to an etch back process used to form shallow trench isolation (STI) regions surrounding the semiconductor fins. This results in lower dummy fin damage during the etch back process, and less dielectric film loss. This reduces the risk of shorting the source/drain regions of adjacent semiconductor fins, and lowers the risk of performance degradation.

In accordance with an embodiment, a method includes depositing a first dielectric layer over and along sidewalls of a first semiconductor fin and a second semiconductor fin, where the first semiconductor fin and the second semiconductor fin extend upwards from a semiconductor substrate; depositing a second dielectric layer over the first dielectric layer; depositing a third dielectric layer over the second dielectric layer, where materials of the second dielectric layer and the third dielectric layer are different, where the third dielectric layer has a carbon concentration that is in a range from 15 percent to 25 percent by weight of carbon, and a material of the first dielectric layer is different from the material of the second dielectric layer; and recessing the first dielectric layer and the second dielectric layer to expose sidewalls of the first semiconductor fin and the second semiconductor fin and to form a dummy fin between the first semiconductor fin and the second semiconductor fin. In an embodiment, the third dielectric layer includes SiCN. In an embodiment, the third dielectric layer has a silicon concentration that is in a range from 45 percent to 50 percent by weight of silicon. In an embodiment, the method further includes planarizing the first dielectric layer, the second dielectric layer and the third dielectric layer to expose top surfaces of the first semiconductor fin and the second semiconductor fin, where top surfaces of the first dielectric layer, the second dielectric layer and the third dielectric layer are coplanar with the top surfaces of the first semiconductor fin and the second semiconductor fin; and selectively depositing a fourth dielectric layer over the top surfaces of the third dielectric layer, the first semiconductor fin and the second semiconductor fin. In an embodiment, the third dielectric layer and the fourth dielectric layer include different materials. In an embodiment, the third dielectric layer and the fourth dielectric layer include the same material. In an embodiment, depositing the fourth dielectric layer includes a deposition process using $SiH_2Cl_2$. In an embodiment, the second dielectric layer includes silicon oxide.

In accordance with an embodiment, a semiconductor device includes a first fin structure and a second fin structure protruding from a substrate; a first epitaxial source/drain region in the first fin structure; a second epitaxial source/drain region in the second fin structure; a shallow trench isolation (STI) region between the first fin structure and the second fin structure; and a dummy fin disposed between the first epitaxial source/drain region and the second epitaxial source/drain region, where the dummy fin includes a first dielectric material and a second dielectric material, the first dielectric material and the second dielectric material having carbon concentrations that are in a range from 15 percent to 25 percent by weight of carbon, where the first dielectric material has a greater percentage atomic carbon concentration than a percentage atomic carbon concentration of the second dielectric material. In an embodiment, the dummy fin is in physical contact with the first epitaxial source/drain region and the second epitaxial source/drain region, and where the dummy fin isolates the first epitaxial source/drain region from the second epitaxial source/drain region. In an embodiment, the first dielectric material and the second dielectric material have a silicon concentration that is in a range from 45 percent to 50 percent by weight of silicon. In an embodiment, top surfaces of the first fin structure and the second fin structure are coplanar with a top surface of the dummy fin. In an embodiment, the semiconductor device further includes a dielectric liner surrounding lower portions of the first dielectric material and the second dielectric material, where the first dielectric material is disposed between the second dielectric material and the dielectric liner, and where the lower portions of the first dielectric material and the second dielectric material are below a top surface of the STI region. In an embodiment, the semiconductor device further includes a gate dielectric layer over the first fin structure, the second fin structure and the dummy fin; and a gate electrode over the gate dielectric layer, where a top surface of the dielectric liner is in physical contact with the gate dielectric layer.

In accordance with an embodiment, a semiconductor device includes a first fin and a second fin extending from a substrate; an isolation region on opposite sides of each of the first fin and the second fin; a dummy fin disposed between the first fin and the second fin, wherein the dummy fin comprises a first dielectric material, a second dielectric material, a third dielectric material, and a fourth dielectric material, wherein the first dielectric material and the second dielectric material have carbon concentrations that are in a range from 15 percent to 25 percent by weight of carbon, wherein the first dielectric material has a greater percentage atomic carbon concentration than an atomic percentage carbon concentration of the second dielectric material, and wherein the first dielectric material is physically separated from the third dielectric material and the fourth dielectric material by the second dielectric material; and a gate stack over the dummy fin. In an embodiment, the semiconductor device further includes a dummy contact extending through the gate stack to be in physical contact with the dummy fin. In an embodiment, a thickness of the first dielectric material and a thickness of the second dielectric material are the same. In an embodiment, a thickness of the first dielectric material is smaller than a thickness of the second dielectric material. In an embodiment, a topmost surface of the third dielectric material is lower than topmost surfaces of the first dielectric material, the second dielectric material and the fourth dielectric material. In an embodiment, an entirety of the fourth dielectric material is above a top surface of the isolation region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first fin structure and a second fin structure protruding from a substrate;
a first epitaxial source/drain region in the first fin structure;
a second epitaxial source/drain region in the second fin structure;
a shallow trench isolation (STI) region between the first fin structure and the second fin structure;
a dummy fin disposed between the first epitaxial source/drain region and the second epitaxial source/drain region, wherein the dummy fin comprises a first dielectric material and a second dielectric material, the first dielectric material and the second dielectric material having carbon concentrations that are in a range from 15 percent to 25 percent by weight of carbon, wherein the first dielectric material has a greater percentage atomic carbon concentration than a percentage atomic carbon concentration of the second dielectric material; and
a dielectric liner disposed on sidewalls and a top surface of the STI region, wherein the dielectric liner is also disposed between the STI region and the dummy fin, wherein a third dielectric material of the STI region is different from a fourth dielectric material of the dielectric liner, wherein topmost surfaces of the dielectric liner are disposed below a top surface of the first dielectric material, a top surface of the second dielectric material, and a topmost surface of the first fin structure.

2. The semiconductor device of claim 1, wherein the dummy fin is in physical contact with the first epitaxial source/drain region and the second epitaxial source/drain region, and wherein the dummy fin isolates the first epitaxial source/drain region from the second epitaxial source/drain region.

3. The semiconductor device of claim 1, wherein the first dielectric material and the second dielectric material have a silicon concentration that is in a range from 45 percent to 50 percent by weight of silicon.

4. The semiconductor device of claim 1, wherein top surfaces of the first fin structure and the second fin structure are coplanar with a top surface of the dummy fin.

5. The semiconductor device of claim 1, wherein the dielectric liner surrounds lower portions of the first dielectric material and the second dielectric material, wherein the first dielectric material is disposed between the second dielectric material and the dielectric liner, and wherein the lower portions of the first dielectric material and the second dielectric material are below a top surface of the STI region.

6. The semiconductor device of claim 5, further comprising:
a gate dielectric layer over the first fin structure, the second fin structure and the dummy fin; and
a gate electrode over the gate dielectric layer, wherein a top surface of the dielectric liner is in physical contact with the gate dielectric layer.

7. A semiconductor device comprising:
a first fin and a second fin extending from a substrate;
an isolation region on opposite sides of each of the first fin and the second fin;
a dummy fin disposed between the first fin and the second fin, wherein the dummy fin comprises a first dielectric material, a second dielectric material, a third dielectric material, and a fourth dielectric material, wherein the first dielectric material and the second dielectric material have carbon concentrations that are in a range from 15 percent to 25 percent by weight of carbon, wherein the first dielectric material has a greater percentage atomic carbon concentration than an atomic percentage carbon concentration of the second dielectric material, and wherein the first dielectric material is physically separated from the third dielectric material and the fourth dielectric material by the second dielectric material; and
a gate stack over the dummy fin.

8. The semiconductor device of claim 7, further comprising a dummy contact extending through the gate stack to be in physical contact with the dummy fin.

9. The semiconductor device of claim 7, wherein a thickness of the first dielectric material and a thickness of the second dielectric material are the same.

10. The semiconductor device of claim 7, wherein a thickness of the first dielectric material is smaller than a thickness of the second dielectric material.

11. The semiconductor device of claim 7, wherein a topmost surface of the third dielectric material is lower than topmost surfaces of the first dielectric material, the second dielectric material and the fourth dielectric material.

12. The semiconductor device of claim 7, wherein an entirety of the fourth dielectric material is above a top surface of the isolation region.

13. A semiconductor device comprising:
a first fin structure, a second fin structure, and a third fin structure protruding from a substrate, wherein the first fin structure and the second fin structure are spaced apart from each other by a first fin pitch, the second fin structure and the third fin structure are spaced apart from each other by a second fin pitch, and wherein the second fin pitch is greater than the first fin pitch;
a first epitaxial source/drain region in the first fin structure;
a second epitaxial source/drain region in the second fin structure;
a third epitaxial source/drain region in the third fin structure;
a shallow trench isolation (STI) region between the second fin structure and the third fin structure;
a dummy fin disposed between the second epitaxial source/drain region and the third epitaxial source/drain region, wherein the dummy fin comprises a first dielectric material and a second dielectric material, the first dielectric material and the second dielectric material having carbon concentrations that are in a range from 15 percent to 25 percent by weight of carbon; and
a dielectric liner disposed on sidewalls and a top surface of the STI region, wherein the dielectric liner is also disposed between the STI region and the dummy fin, wherein the first dielectric material of the dummy fin and the second dielectric material of the dummy fin protrude above top surfaces of the STI region and the dielectric liner, wherein a top surface of the first dielectric material and a top surface of the second dielectric material are coplanar, wherein a first vertical portion of the first dielectric material is in physical contact with a first sidewall of the second dielectric material, and wherein a second vertical portion of the first dielectric material is in physical contact with a second sidewall of the second dielectric material.

14. The semiconductor device of claim 13, wherein the first dielectric material has a greater percentage atomic carbon concentration than a percentage atomic carbon concentration of the second dielectric material.

15. The semiconductor device of claim 13, wherein the first dielectric material has a first thickness that is in a range from 1 nm to 5 nm.

16. The semiconductor device of claim 13, wherein the first dielectric material and the second dielectric material comprise SiCN.

17. The semiconductor device of claim 13, wherein each of the first dielectric material and the second dielectric material have a silicon concentration that is in a range from 45 percent to 50 percent by weight of silicon.

18. The semiconductor device of claim 13, wherein the second fin pitch is in a range from 20 nm to 50 nm.

19. The semiconductor device of claim 13, wherein a third material of the dielectric liner is different from a fourth material of the STI region.

20. The semiconductor device of claim 19, wherein the third material of the dielectric liner is different from the first dielectric material and the second dielectric material.

* * * * *